(12) United States Patent
Shemesh et al.

(10) Patent No.: US 6,670,610 B2
(45) Date of Patent: Dec. 30, 2003

(54) SYSTEM AND METHOD FOR DIRECTING A MILLER

(75) Inventors: Dror Shemesh, Petah Tikva (IL); Ariel Ben-Porath, Rehovot (IL); Dubi Shachal, Rehovot (IL); Alexey Stepanov, Rishon LeZion (IL)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/005,190

(22) Filed: Nov. 26, 2001

(65) Prior Publication Data

US 2003/0098416 A1 May 29, 2003

(51) Int. Cl.[7] ................................. H01J 37/26
(52) U.S. Cl. ...................................... 250/309
(58) Field of Search ........................ 250/309, 310, 250/307, 491.1

(56) References Cited

U.S. PATENT DOCUMENTS

| 5,541,411 | A | * | 7/1996 | Lindquist et al. | ........... 250/309 |
|---|---|---|---|---|---|
| 5,616,921 | A | * | 4/1997 | Talbot et al. | ............... 250/307 |
| 5,952,658 | A | * | 9/1999 | Shimase et al. | ........... 250/309 |
| 6,414,307 | B1 | * | 7/2002 | Gerlach et al. | ............ 250/309 |
| 6,497,194 | B1 | * | 12/2002 | Libby et al. | ............ 118/723 FI |
| 2002/0074494 | A1 | * | 6/2002 | Lundquist | ................... 250/307 |

* cited by examiner

Primary Examiner—John R. Lee
Assistant Examiner—Phillip A Johnston
(74) Attorney, Agent, or Firm—Blakely Sokoloff Taylor & Zafman

(57) ABSTRACT

A system and method for directing the object, such as a semiconductor die. The system includes a first images such as a scanning electron microscope, a stage for moving the object and a second imager and miller such as a focused ion beam generator. The object is images to locate a desired location in which the object is to be milled and a landmark that is utilized for directing the miller. The system can include additional steps of milling, analyzing and movement of the object.

83 Claims, 19 Drawing Sheets

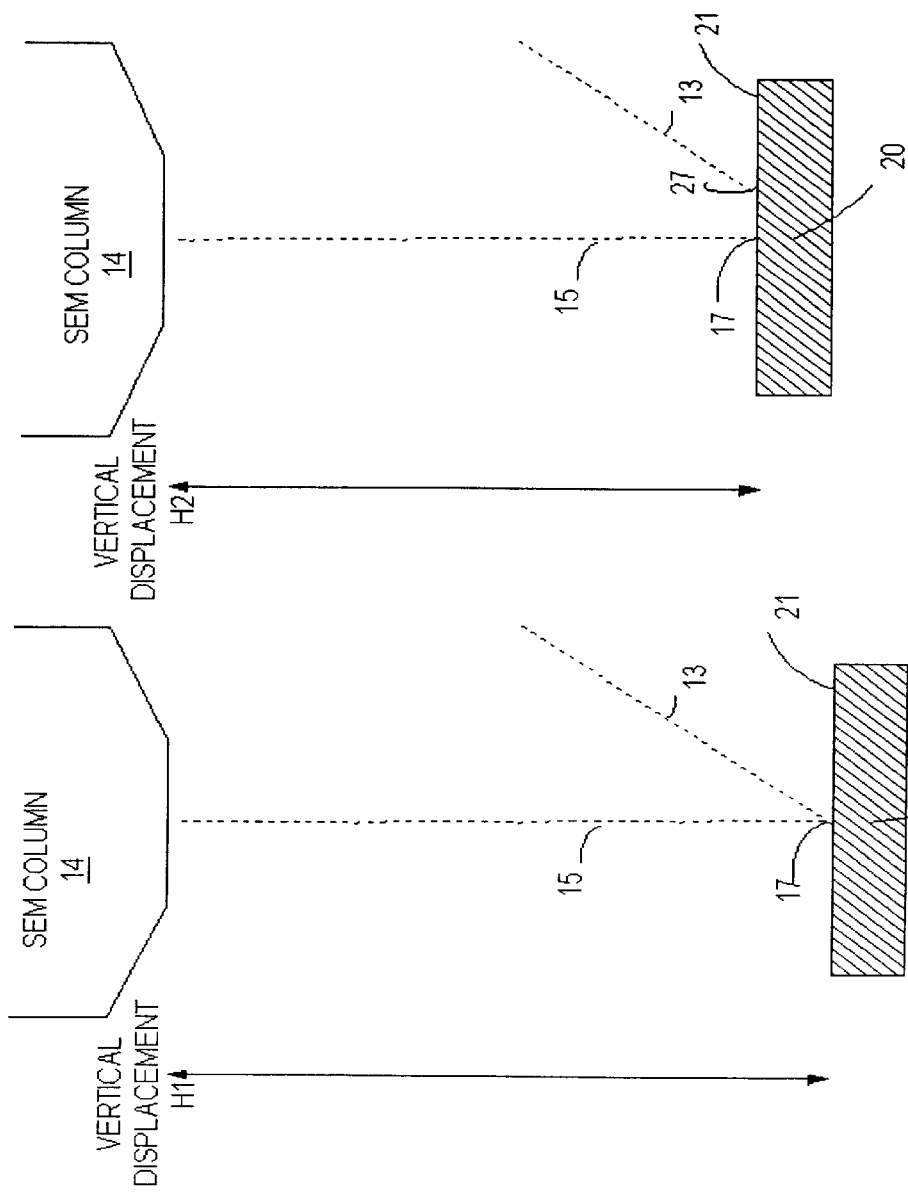

SYSTEM AND METHOD FOR DIRECTING A MILLER

FIELD OF THE INVENTION

The present invention relates to systems and methods for directing a miller and especially systems and methods for imaging and milling dies for defect detection and analysis.

BACKGROUND OF THE INVENTION

Scanning electron microscopes are known in the art. U.S. Pat. No. 5,659,172 of Wagner describes a method for reliable defect detection using multiple perspective Scanning Electron Microscope (SEM) images. A SEM usually includes an electron gun for generating an electron beam, a SEM lens system for focusing and converging the electron beam, a deflection coil for deflecting the electron beam, a detector for detecting electrons, such as secondary emitted electrons or reflected electrons that are emitted/reflected from an object and a processor that is operative to construct SEM images in response to detection signals provided from the detector. Usually, the electron gun, the SEM lens system and the deflection coil are located within a column, that is commonly referred to as SEM column. The resolution of a SEM and its power consumption are inversely proportional to the distance between the SEM column and the object. This distance is also referred to as a working distance. The detector can also be placed within the SEM column.

Focused ion beam (FIB) systems are known in the art. FIB systems are generally utilized to perform die milling and cross sectioning. The milled or cross sectioned die is usually analyzed by an inspection device, such as a SEM, to detect defects. FIB systems can also be utilized to generate FIB images. FIB systems usually include an ion source for generating an ion beam, a FIB lens system for focusing the ion beam to provide a focused ion beam and an ion beam deflector for deflecting the focused ion beam. A FIB system that is operative to generate a FIB image also has a detector and a processor. Usually, the ion source, the FIB lens system and the ion beam deflector are located within a column, that is commonly referred to as FIB column. The detector can also be placed within the FIB column.

SEM images are generated by irradiating an object with an electron beam, collecting signals resulting from an interaction of the electron beam with at least one portion of the object and processing the collected signals. FIB images are generated in a similar analogues manner, except that the object is irradiated with a focused ion beam.

Systems that include both FIB and SEM systems are known in the art and are referred to as FIB/SEM systems. SEM system allows to inspect a surface of an inspected object, such as a surface of a multi layered die. FIB systems allow for milling the surface and exposing inner layers to inspection. Usually, after the FIB mills the die, the SEM system is utilized to inspect the revealed layers and to further analyze the milled die for detecting defects. A prior art FIB/SEM system is the XL860 DualBeam Workstation of FEI. Such a prior art system 10 is illustrated at FIG. 1. System 10 includes FIB column 12 and SEM column 14. FIB column generated ion beam 15 and SEM column 14 generates electron beam 13. System 10 further has stage 18, detectors 26 and 28 and at least one processor (not shown) coupled to detectors 26 and 28 and being operative to generate images. Stage 18 supports the object, such a wafer 20. Detectors 26 and 28 receive electrons, such as secondary emitted electrons and reflected electrons, emitted or reflected from wafer 20 in response to an irradiation of wafer 20 by electron beam 13 or ion beam 15, and provide detection signals to the processor.

FIB column 12 is angularly displaced from SEM column 14 at a predefined angle and is located substantially adjacent to SEM column 14. This arrangement forces both columns to be placed in a relatively large working distance from wafer 20. For example, at XL860 DualBeam Workstation the working distance of the SEM column is 5 mm and the working distance of FIB column 12 is 16.5 mm.

This arrangement also limits the width of the columns and further reduces the performances of at least one of SEM column 14 and FIB column 12.

Ideally, during use of the system for defect detection and analysis, electron beam 13 and focused ion beam 15 are aimed to the same point on an object that is evaluated. Because of the angular displacement between SEM column 14 and FIB column 12 changes in the vertical displacement, caused by changes in the object surface or mechanical inaccuracies of a stage that supports and moves the die, between the surface of wafer 20 and either one of the columns must be compensated by a calibration step. The calibration is usually done manually and is time-consuming. The need for the calibration process is illustrated at FIGS. 2 and 3. A change in the vertical displacement (H1 of FIG. 2 versus H2 of FIG. 3) between surface 21 of wafer 20 and SEM column 14 (and accordingly also between surface 21 and FIB column 12) causes ion beam 13 to irradiate point 27 on surface 20 while electron beam 15 irradiates point 17. In order to have both beams irradiate the same point one of the beams must be slightly deflected.

There is a need to provide an efficient system and method for directing a miller. There is a need to provide a system that efficiently combines the capabilities of a scanning electron microscope and of a focused ion beam generator. There is a need to provide a system and method that allows placement of an object at a small working distance from a scanning electron microscope and at a small working distance from a focused ion beam generator.

SUMMARY OF THE INVENTION

The invention provides a method for directing a miller, the system including: a first imager, for locating a landmark on an die; a stage, for moving the die from a first location in which the object is accessible to the first imager to a second location in which the die is accessible to a miller; and a second imager, for directing a miller to mill the die at the desired location.

The second imager can be operative to locate the landmark and to direct the miller to mill at the desired location in response to landmark information and displacement information. The second imager can be operative to generate at least one image of at least one portion of the die and to locate the landmark in response to an analysis of the at least one image of the at least one portion. The second imager can also be operative to generate at least one image of at least one portion of the die and to locate the landmark in response to a comparison between a first image that includes the landmark and the at least one image of the at least one portion, the first image being generated by the first imager.

The first imager can include a scanning electron microscope. The scanning electron microscope includes a SEM column, at least one detector and at least one processor operable to generate SEM images of the die.

The second imager conveniently is also capable of milling the object. A focused ion beam miller and imager can be utilized for imaging and milling. The focused ion beam miller and imager can include a focused ion beam column, for generating and controlling a focused ion beam, at least one detector and a processor, the processor being operable to generate focused ion beam images of the die, to locate the landmark and to direct the miller.

The second imager can include a scanning electron microscope. The scanning electron microscope can include a SEM column, at least one detector and at least one processor operable to generate SEM images of the die.

Conveniently, the first imager and the second miller are spaced apart. The distance between the first imager and the miller exceeds 10 mm. The stage is operative to place the object at a small working distance from the miller and at a small working distance from the first imager. The sum of the small working distance from the miller and the small working distance from the first imager preferably does not exceed 15 mm but can also be limited to 5 mm or even less.

The invention provides a system for directing a miller that is operative to execute a step of angle compensation, for correcting differences between images generated by the first imager and the second imager, the differences were introduced because the images were generated from different angles.

The invention provides a system for directing a miller that is operative to execute a step of imaging process variation compensation, for correcting differences between images generated by the first imager and the second imager, the differences were introduced because the images are generated by distinct image generation processes.

The invention provides a system for directing a miller that is operative to execute a step of determining a landmark group of pixels of the image generated by the first imager and to execute a correlating step for determining a correlation between the landmark group of pixels and pixels of an image generated by the second imager.

The invention provides a system for directing a miller in which the first imager is operable to generate a landmark. The landmark can be generated by adding material to an object or by milling the object. The landmark can be generated by an interaction between an electron beam and an additional material, such as a contamination or an injected material.

The invention provides a system for directing a miller wherein the first imager is operative to generate a landmark. The first imager can generate a landmark by either adding particles to the object or by milling the object. Conveniently, the first imager is a scanning electron microscope that is capable of generating the landmark. A gas injection unit may provide gas to enhance the landmark generation process.

The invention provides a system for defect analysis that includes a scanning electron microscope, for generating SEM images and locating a landmark on an object; a focused ion beam miller and imager, for locating the landmark on the object and milling the object at a desired location; and a stage, for moving the inspected from a first location in which the object is accessible to the scanning electron microscope to a second location in which the object is accessible to a focused ion beam miller and imager.

The invention provides a system for defect analysis wherein the focused ion beam miller and imager is operative to (A) locate the landmark and to mill at the desired location in response to landmark information and displacement information, (B) generate at least one image of at least one portion of the object and to locate the landmark in response to an analysis of the at least one image of the at least one portion, or (C) generate at least one image of at least one portion of the object and to locate the landmark in response to a comparison between a first image that includes the landmark and the at least one image of the at least one portion, the first image being generated by the scanning electron microscope.

The invention provides a system for defect analysis wherein the scanning electron microscope includes a SEM column, and the focused ion beam miller and imager includes a FIB column. The FIB column and the SEM column are spaced apart. The distance between the FIB column and the SEM column exceeds 10 mm. The distance is measured between the aperture of the SEM column and the aperture of the FIB column.

The invention provides a system for defect analysis wherein the stage is operative to place the object at a small working distance from the FIB column and at a small working distance from the SEM column. Conveniently, the sum of the small working distance from the FIB column and the small working distance from the SEM column does not exceed 15 mm, but can also not exceed 5 mm.

The invention provides a system for defect analysis wherein the system is operative to execute at least one of the following steps: (a) a step of angle compensation, for correcting differences between images generated by the scanning electron microscope and the focused ion beam miller and imager, the differences were introduced because the images were generated from different angles; (b) a step of imaging process variation compensation, for correcting differences between images generated by the scanning electron microscope and the focused ion beam miller and imager, the differences were introduced because the images are generated by distinct image generation processes; or (c) a step of determining a landmark group of pixels of the image generated by the scanning electron microscope and to execute a correlating step for determining a correlation between the landmark group of pixels and pixels of an image generated by the focused ion beam miller and imager.

The invention provides a system for defect analysis that includes a gas injection unit for providing a gas that interacts with the electron beam to generate the landmark. The landmark being generated by milling or deposition.

The invention provides a method for directing a miller, the method including the steps of: determining a desired location in which an object is to be milled; detecting a landmark by a first imager; moving the object from a first location in which the object is accessible to the first imager to a second location in which the object is accessible to the miller; locating the landmark; and directing the miller to the desired location in response to landmark information and displacement information being generated by the first imager in response to the detection of the landmark.

The invention provides a for directing a miller, the method including the steps of: determining a desired location in which an object is to be milled; searching for a landmark within a predefined area that includes the desired location; generating a landmark if a landmark is not detected within the predefined area; moving the object from a first location in which the object is accessible to the first imager to a second location in which the object is accessible to the miller; locating the landmark; and directing the miller to the desired location in response to landmark information and displacement information being generated by the first imager in response to the detection of the landmark.

The invention provides a method for milling an object, the method including the steps of: determining a desired location in which an object is to be milled; searching for a landmark within a predefined area that includes the desired location; generating a landmark if a landmark is not detected within the predefined area; moving the object from a first location in which the object is accessible to the first imager to a second location in which the object is accessible to the miller; locating the landmark; directing the miller to the desired location in response to landmark information and displacement information being generated by the first imager in response to the detection of the landmark; and milling the object at the desired location.

The invention provides a method for milling an object, the method including the steps of: determining a desired location in which an object is to be milled; detecting a landmark by a first imager; moving the object from a first location in which the object is accessible to the first imager to a second location in which the object is accessible to the miller; locating the landmark; directing the miller to the desired location in response to landmark information and displacement information being generated by the first imager in response to the detection of the landmark; and milling the object.

The invention provides a method for inspecting an object, the method including the steps of: determining a desired location in which an object is to be milled; detecting a landmark by a first imager; moving the object from a first location in which the object is accessible to the first imager to a second location in which the object is accessible to the miller; locating the landmark; directing the miller to the desired location in response to landmark information and displacement information being generated by the first imager in response to the detection of the landmark; milling the object to provide a milled object; moving the milled object from the second location to the first location; and generating information reflecting the milled object.

The invention provides a method for inspecting an object, the method including the steps of determining a desired location in which an object is to be milled; searching for a landmark within a predefined area that includes the desired location; generating a landmark if a landmark is not detected within the predefined area; moving the object from a first location in which the object is accessible to the first imager to a second location in which the object is accessible to the miller; locating the landmark; directing the miller to the desired location in response to landmark information and displacement information being generated by the first imager in response to the detection of the landmark; milling the object to provide a milled object; moving the milled object from the second location to the first location; and generating information reflecting the milled object.

The invention provides a method for milling an object, the method including the steps of: determining a desired location in which an object is to be milled; searching for a landmark within a predefined area that includes the desired location; moving the object from a first location in which the object is accessible to the first imager to a second location in which the object is accessible to the miller, if the landmark was not detected within the predefined area; generating a landmark by milling the object and generating landmark information indicative of the landmark; moving the object from the second location to the first location; locating the landmark and generating displacement information; moving the object from the first location to the second location; and detecting the landmark and directing the miller to the desired location in response to the displacement information.

The step of searching for a landmark includes a step of generating images of a portion of the object, by a first imager. The step of generating the images starts by generating a first image of an area that includes the desired location. If the desired location and the landmark are included within that first image the step of searching for an image ends. Else, at least one additional image of at least another portion of the object is generated and analyzed until a landmark is located. It is noted that the landmark can be located outside of an area that is defined by expected inaccuracies in the movement of the object. A landmark can include any shape that is unique within an inaccuracy area that includes the desired location and within an inaccuracy area that includes the landmark. The size and shape of the inaccuracy area are responsive to the accuracy limitation of a stage or other supporting means that supports and moves the object.

According to an aspect of the invention the searching can utilize portion information indicative of the expected image of an at least one portion of the object. The portion information can be driven from previously generated SEM images, from CAD design information and the like.

The invention provides a method for directing a miller, the method involving generating landmark information indicative of the landmark and displacement information reflecting a displacement between the landmark and the desired location. The landmark information can include visual and/or textual information. The visual information can include information representative of an image of the landmark, the landmark and its vicinity, a portion of the image that includes the landmark or the whole SEM image that includes the landmark. The landmark information also defines the location of the landmark. The textual information can include text that describes the landmark such that it can be identified by a second imager. It is noted that the displacement information can also include textual and/or visual information. It is noted that the landmark information and displacement information are stored or transmitted such that they may be retrieved during later steps of the process.

According to an aspect of the invention, the method can include a step of generating desired location information. The desired location information can be utilized for verifying that the miller is directed to the desired location. The desired location information can also include visual and/or textual information.

The step of locating the landmark may involve generating an image and comparing the image to the landmark information, and especially to at least one image generated by the first imager. The step of locating the landmark may include generating images of a portion of the object, starting at a first image of at least a portion of the inaccuracy area that includes the landmark. These images are generated by the second imager. If the first image generated by the second imager includes the landmark then the step of searching the landmark ends. Else, else additional images of portions of the inaccuracy area are taken and analyzed until the landmark is located.

It is noted that the step of locating the landmark can include at least one of the following steps: (A) A step of angle compensation, for correcting differences between the SEM image and the FIB image, the differences were introduced because the images were generated from different angles. The step can include applying a linear transformation on the pixels of at least one image to "tilt" the image. (B) A step of imaging process variation compensation, for correcting differences between the SEM image and the FIB image, the differences were introduced because the FIB image was generated by a FIB system, while the SEM image was generated by a SEM system. This step may include (B.1) generating a first edge image indicative of edges within the SEM image, (B.2) generating a second edge image indicative of edges within the FIB image. An image is usually represented by an array or a matrix of pixels. It is noted that generating an edge image from an image is known in the art and can be implemented by various edge enhancement techniques, such as applying a Canny filter on the pixels of each image. Canny filters are known in the art. A Canny filter can be described as a convolution of a Gaussian operator and a step operator. A Gaussian operator is a set of integers that approximate the profile of a Gaussian function along any row, column or diagonal. An edge image can also generated by applying a gradient operator on the pixels of each image. The application of the gradient operator can be preceded by smoothing the picture. The smoothing step limits the amplification of noise.

The process also includes a step of detecting a location of a landmark in the an image generated by the first imager and an image generated by a second imager. Once the landmark is located within both images the miller is directed to the desired location in response to a displacement between the landmark and the desired location. It is noted that if the landmark is not detected in an image generated by the second imager, a step of searching for the landmark is initiated. The step of detecting a location of a landmark can include the following steps: (a) Determining a landmark group of pixels of the image generated by the first imager. The landmark group of pixels are pixels of at least a portion of the landmark but can also include pixels of the vicinity of the landmark. (b) Correlation step in which a correlation between that landmark group and group of pixels within the image generated by a second imager is calculated to provide a correlation coefficient. Conveniently, the image generated by the second imager is scanned to find the group that is most correlated with the landmark group. It the correlation coefficient exceeds a predefined value then the landmark is located. If the correlation coefficient is below the predefined threshold, it is assumed the image does not include the landmark, and another image of a different portion of the object is taken by second imager. The other image is then processed to locate the landmark.

The step of generating a landmark can include implementing various milling, etching, depositing techniques. The landmark can be generated by a scanning electron microscope. The scanning electron microscope generates an electron beam that interacts with the object to generate the landmark. The electron beam can also interact with additional material such as to enhance or speed up the generation of the landmark.

The characteristics of the landmark, such as height or depth can be controlled either automatically or manually to assure that the landmark can be located during the step of detecting the landmark.

BRIEF DESCRIPTION OF THE DRAWINGS

FIGS. 2–3 are schematic illustrations of a portion of the prior art system of FIG. 1, illustrative of a need in a calibration step.

DETAILED DESCRIPTION OF PREFERRED EMBODIMENTS

It should be noted that the particular terms and expressions employed and the particular structural and operational details disclosed in the detailed description and accompanying drawings are for illustrative purposes only and are not intended to in any way limit the scope of the invention as described in the appended claims.

FIGS. 4–7 illustrate systems for milling an object, according to preferred embodiment of the invention.

Figure 1:
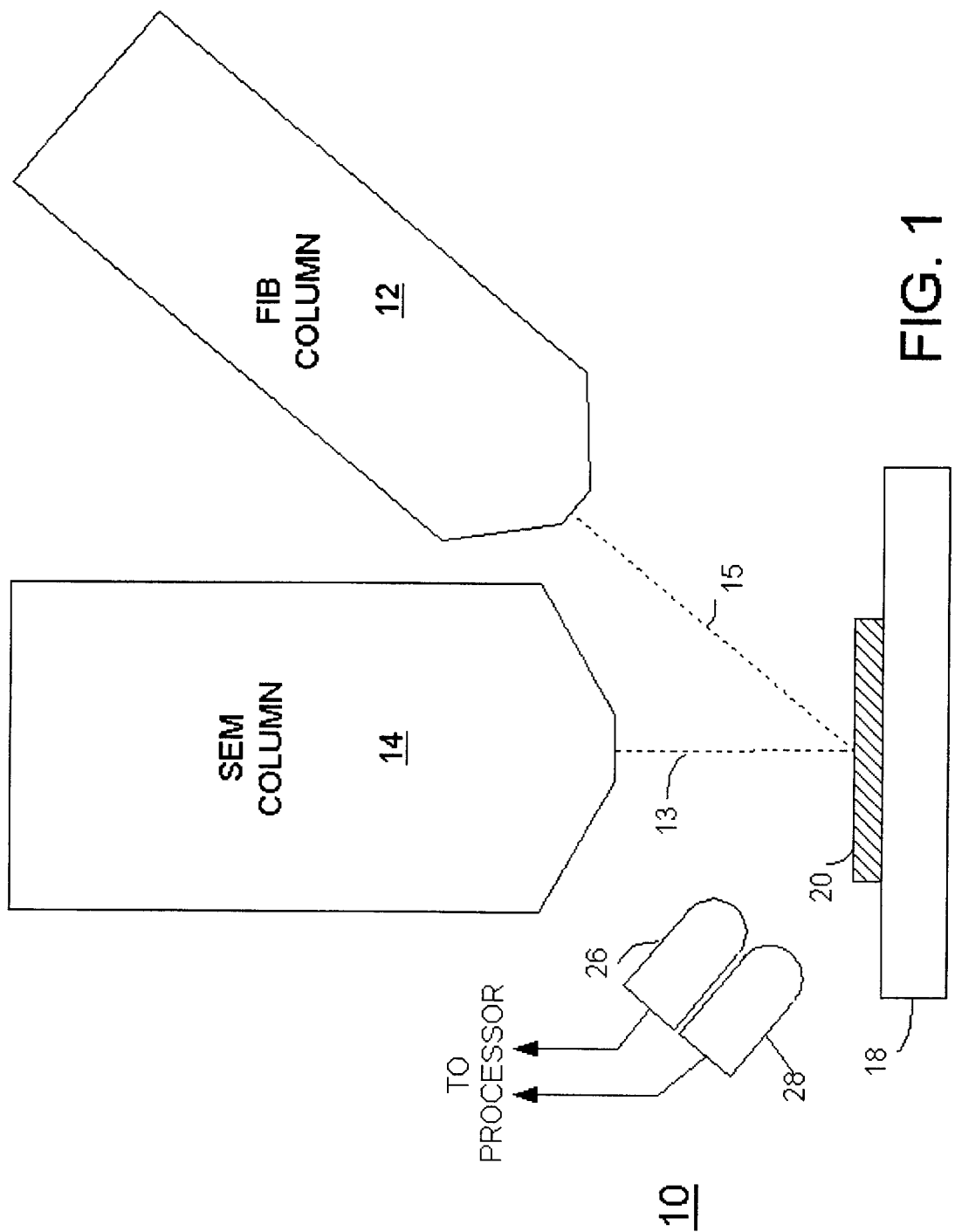
FIG. 1 is a schematic description of a prior art FIB/SEM system.
Figure 4:
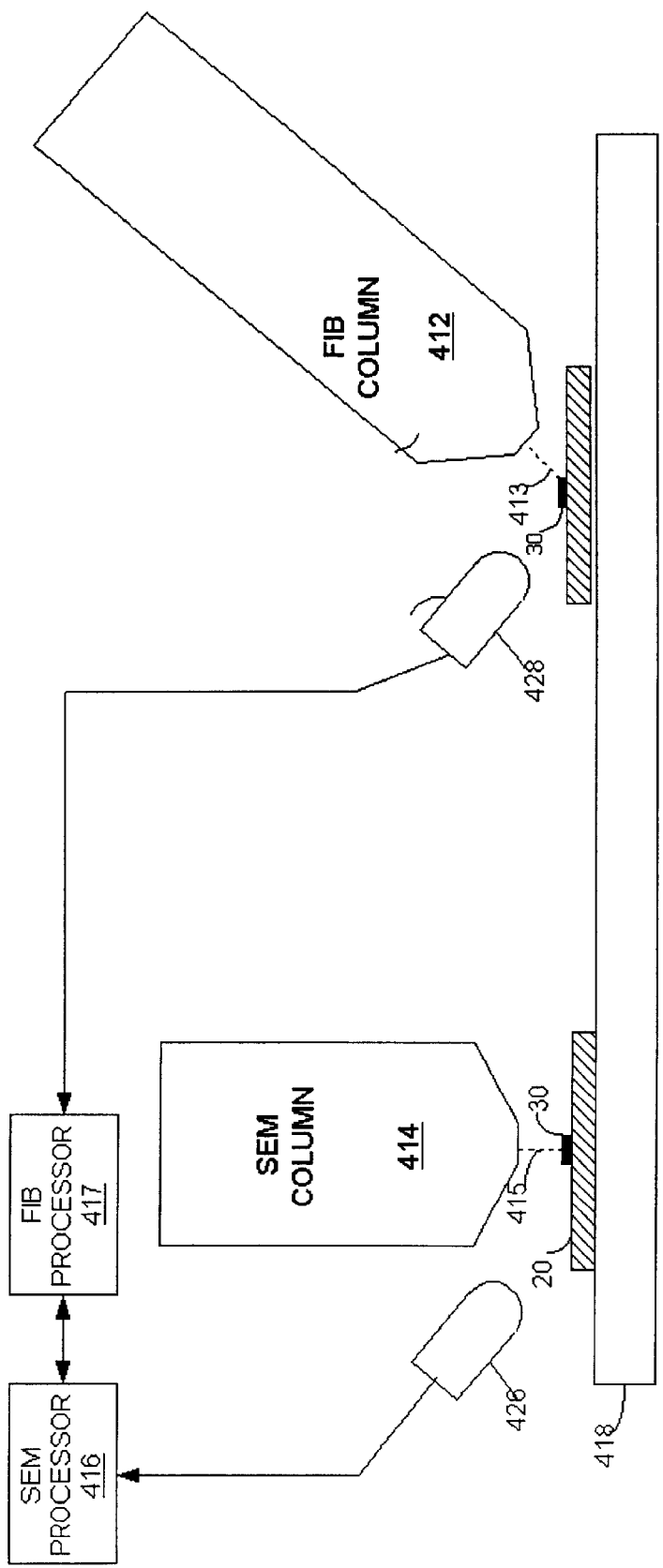
FIGS. 4–7 illustrate systems for milling an object, according to various embodiments of the invention.

System 400 of FIG. 4 includes: (a) A vertical Scanning Electron Microscope column 414 operative to generate an electron beam 415; (b) Detector 426, for detecting electrons, such as but not limited to secondary electrons, backscattered electrons, that are generated as a response of an interaction between electron beam 415 and an object, such as wafer 30, being located at a first position; (c) A tilted Focused Ion Beam generator 412, operative to generate focused ion beam 413; (d) Detector 428, for detecting ions and/or electrons that are generated as a response of an interaction between focused ion beam 413 and an object, such as wafer 30, being located at a second position; it is noted wafer 30 is not simultaneously located in both positions; (e) SEM processor 416, coupled to detector 426 for generating a SEM image in response to detection signals provided by detector 426 and for generating location information indicative of the location of a landmark and a displacement between the landmark and the desired location; (f) FIB processor 417, coupled to SEM processor 416 for receiving the location information and the SEM image of the landmark, the FIB processor is operative to generate a FIB image in response to detection signals provided by detector 428 and to direct focused ion beam 413 to a desired location in response to an analysis of the FIB image, SEM image and the location information, and (f) Stage 20 for moving the object from a first location in which the object is accessible to the SEM column 414 to a second location in which the object is accessible to FIB column 412.

A first imager includes vertical SEM column 414, detector 426 and SEM processor 416. A second imager includes tilted FIB column 412, detector 428 and FIB processor 417. FIB column 412 is also configured to perform milling and cross sectioning of an object. Usually, milling is done at the vicinity of a suspected defect, but this is not necessary.

Figure 5:
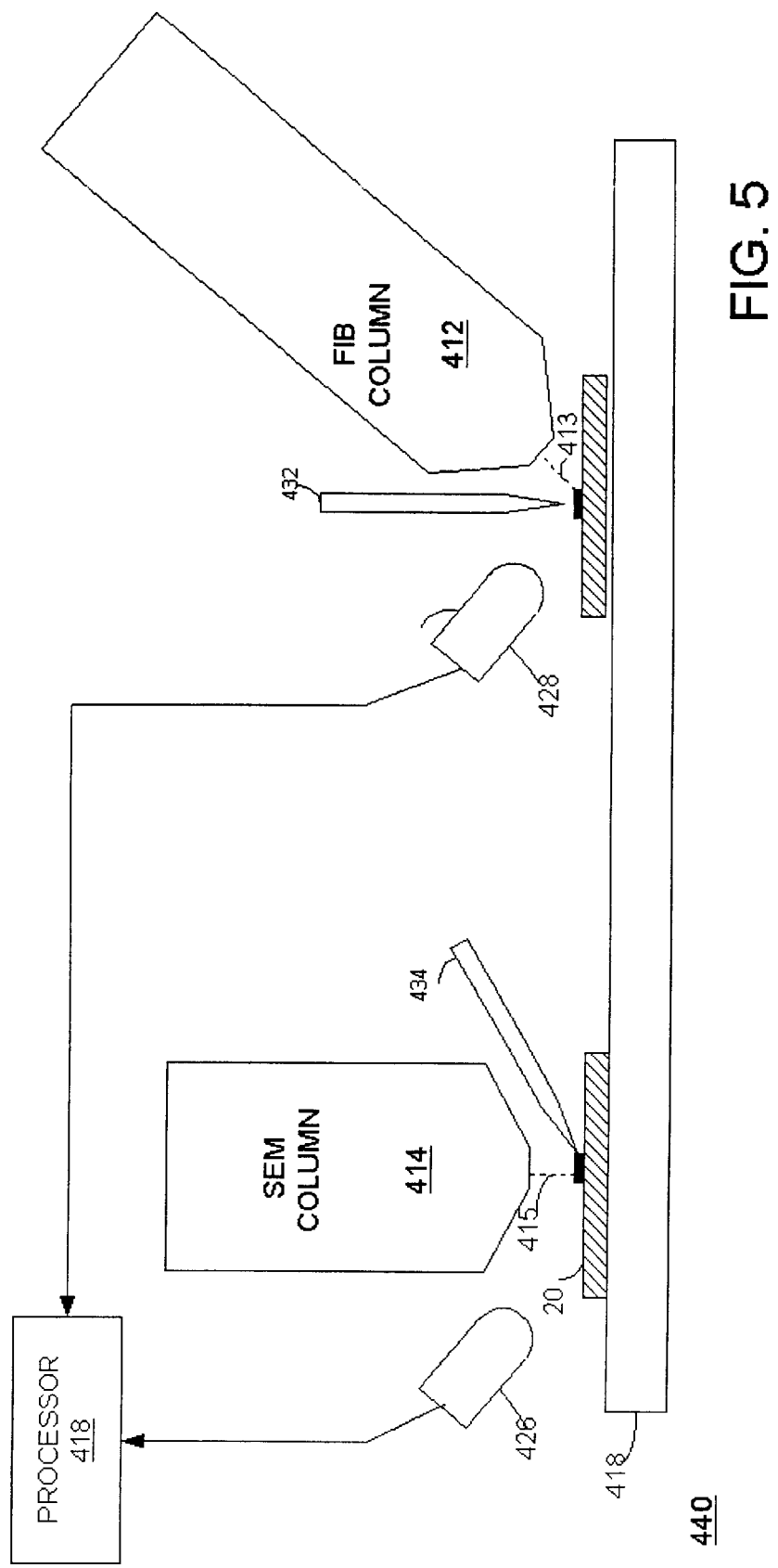

System 440 of FIG. 5 is analogous to system 400 of FIG. 4 but has gas injectors 434 and 432 and has a single processor (processor 416) instead of SEM processor 416 and FIB processor 418. Gas injector 434 is located at the vicinity of the first location for providing materials to interact with electron beam 415 to generate a landmark, such as landmarks 50 or 52 of FIG. 6. The landmark can be generated by milling or deposition technique. For example, gas injector 434 can be used to deposit conductive or insulating material on the surface of the object. Gas injector 434 can provide iodine-based precursor to accelerate milling.

Gas injector 432 is located at the vicinity of the second location to accelerate the milling of the object by ion beam 413.

It is noted that the object, SEM column and FIB column 412 are conveniently located within at least one vacuum chamber that has a circulation system that pumps the injected gas from the vacuum chamber. Fast pumping is required to allow fast alternation between SEM column 414 landmark generation and SEM column 414 image generation.

Figure 6:
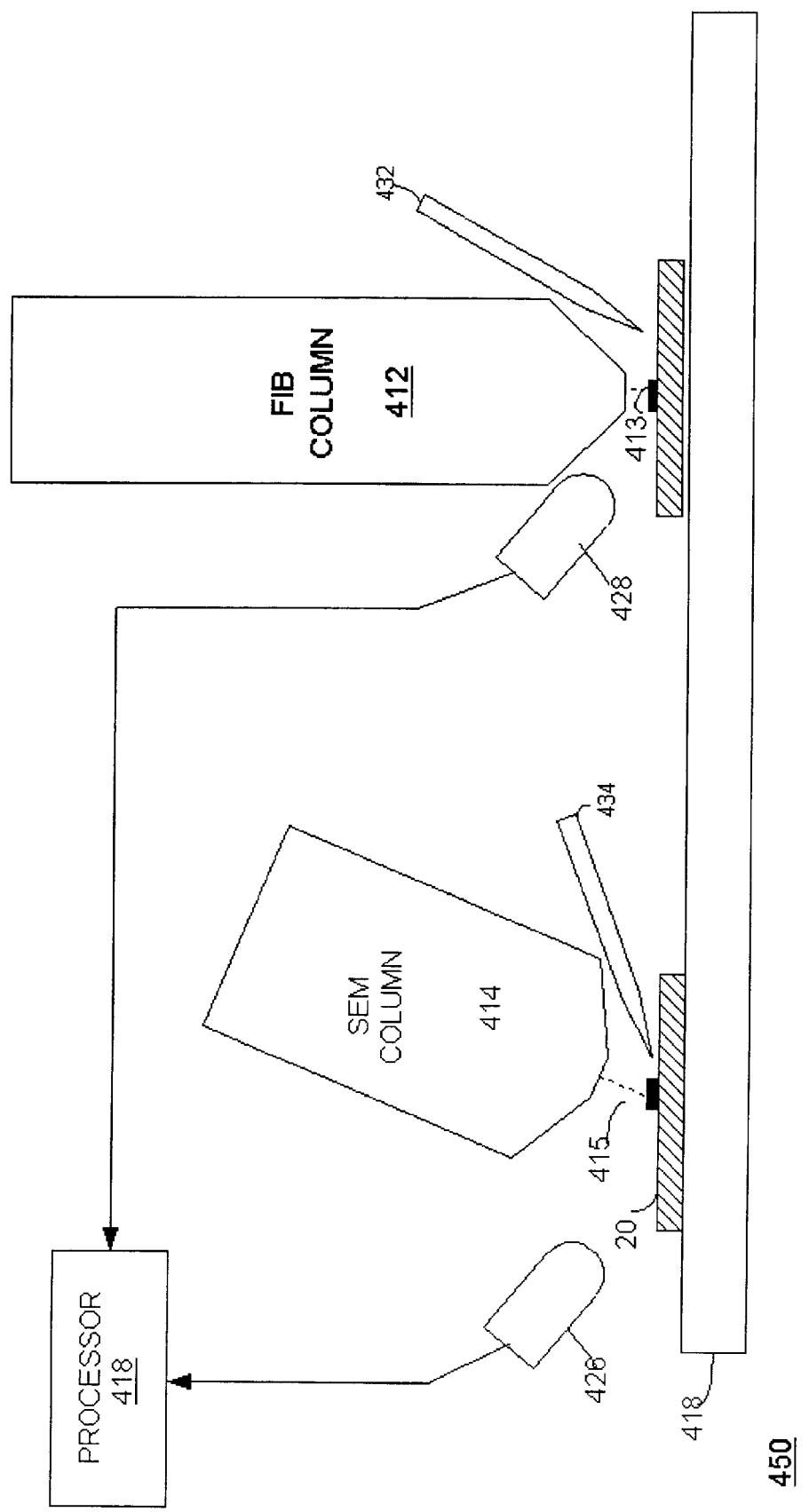

System 450 of FIG. 6 is analogous to system 440 of FIG. 5 but FIB column 412 is vertical and SEM column 414 is tilted. System 460 of FIG. 10 is analogues to system 450 of FIG. 9 but FIB column 412 and SEM column are both vertical and much closer to each other.

Figure 7:
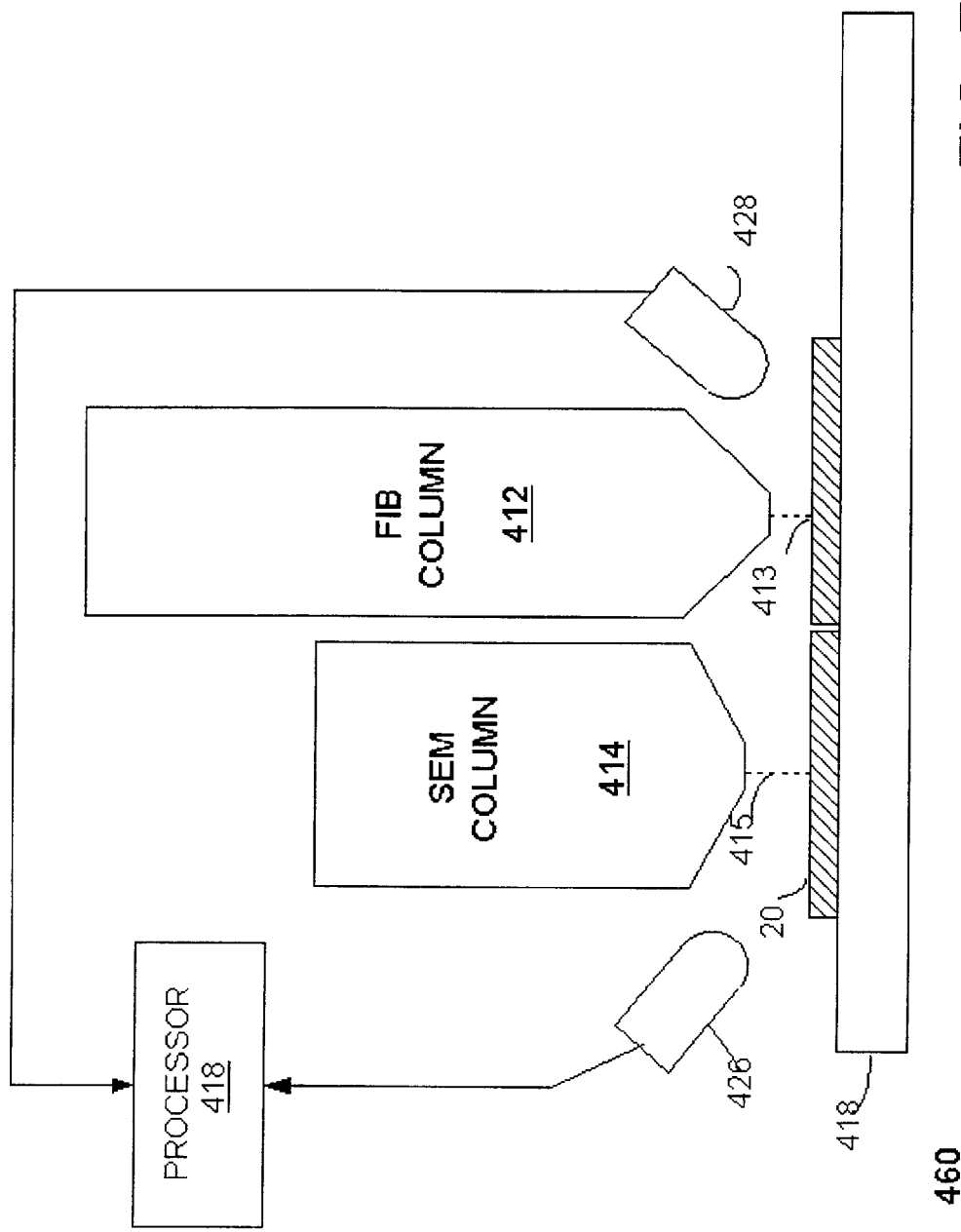

Processor 418 of FIGS. 5–7 generates a SEM image and a FIB image and processed these two images to direct FIB column 412 to a desired location. The process may include at least one of the following compensation steps:

(A) A step of angle compensation, for correcting differences between the SEM image and the FIB image, the differences were introduced because the images were generated from different angles, as illustrated by FIGS. 4–6. The step can include applying a linear transformation on the pixels of at least one image to "tilt" the image.

(B) A step of imaging process variation compensation, for correcting differences between the SEM image and the FIB image, the differences were introduced because the FIB image was generated by a FIB system, while the SEM image was generated by a SEM system. This step may include (B.1) generating a first edge image indicative of edges within the SEM image, (B.2) generating a second edge image indicative of edges within the FIB image. An image is usually represented by an array or a matrix of pixels. It is noted that generating an edge image from an image is known in the art and can be implement by various edge enhancement techniques, such as applying a applying a Canny filter on the pixels of each image. Canny filters are known in the art. A Canny filter can be described as a convolution of a Gaussian operator and a step operator. A Gaussian operator is a set of integers that approximate the profile of a Gaussian function along any row, column or diagonal. An edge image can also generated by applying a gradient operator on the pixels of each image. The application of the gradient operator can be preceded by smoothing the picture. The smoothing step limits the amplification of noise.

The process also includes a step of detecting a location of a landmark in the SEM image and the FIB image. Once the landmark is located within both images the FIB generator can be directed to the desired location in response to a displacement between the landmark and the desired location. It is noted that if the landmark is not detected in a FIB image, a step of searching the landmark is initiated. The step of detecting a location of a landmark can include the following steps: (I.I) Determining a landmark group of pixels of the SEM image. The landmark group of pixels are pixels of at least a portion of the landmark but can also include pixels of the vicinity of the landmark. (II.I) Correlation step in which a correlation between that landmark group and group of pixels within the FIB image is calculated to provide a correlation coefficient. Conveniently, the FIB image is scanned and to find the group that is most correlated with the landmark group. It the correlation coefficient exceeds a predefined value then the landmark is located. If the correlation coefficient is below the predefined threshold, it is assumed the FIB image does not include the landmark, and another FIB image of a different portion of the object is taken. The other image is then processed to locate the landmark.

It is noted that at least one step of the mentioned above steps of detecting a location of the landmark and compensation step can be implemented by a step of processing a registration correction, as illustrated at U.S. Pat. No. 5,659,172 of Wagner that is incorporated by reference.

Figure 8:
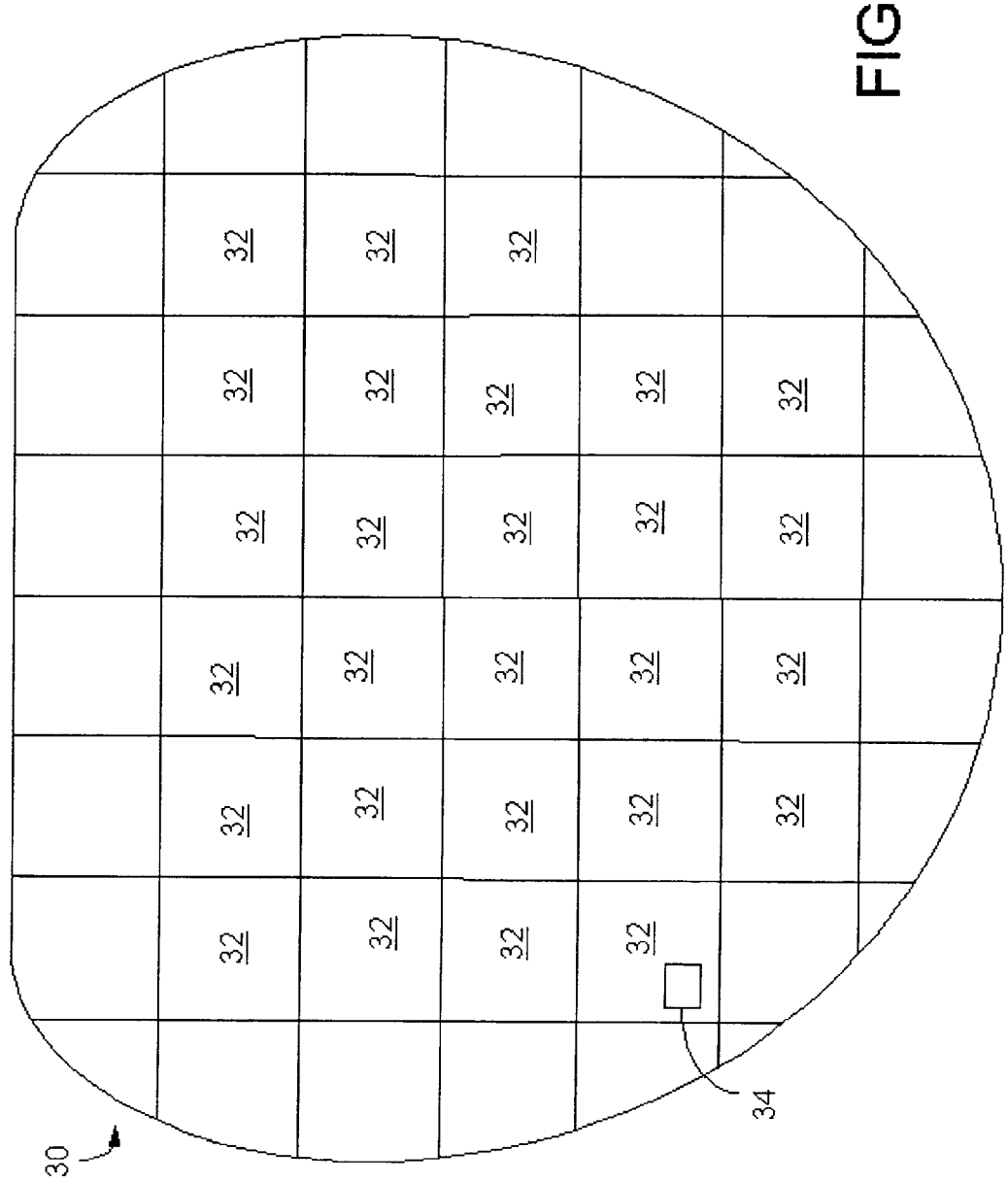
FIG. 8 illustrates a wafer that includes a plurality of dies.

Referring FIG. 8 there is illustrated wafer 30 that includes a plurality of dies 32. Dies are usually milled or cross sectioned as a part of detect analysis, but the milling can also be performed for various other reasons, such as but not limited to repairing a die. For convenience of explanation it is assumed that die 32 is milled at a location of a suspected defect or at the vicinity of a defect, as part of a defect analysis process. The milling allows a defect analyzer, such as a review SEM to generate images of layers that are located under the surface of the die, because the milling can remove materials on the surface, of the surface and below the surface and expose underlying materials and layers. During the process of defect detection or defect review images of portions of dies 32, such as portion 34, are generated.

Figure 9:
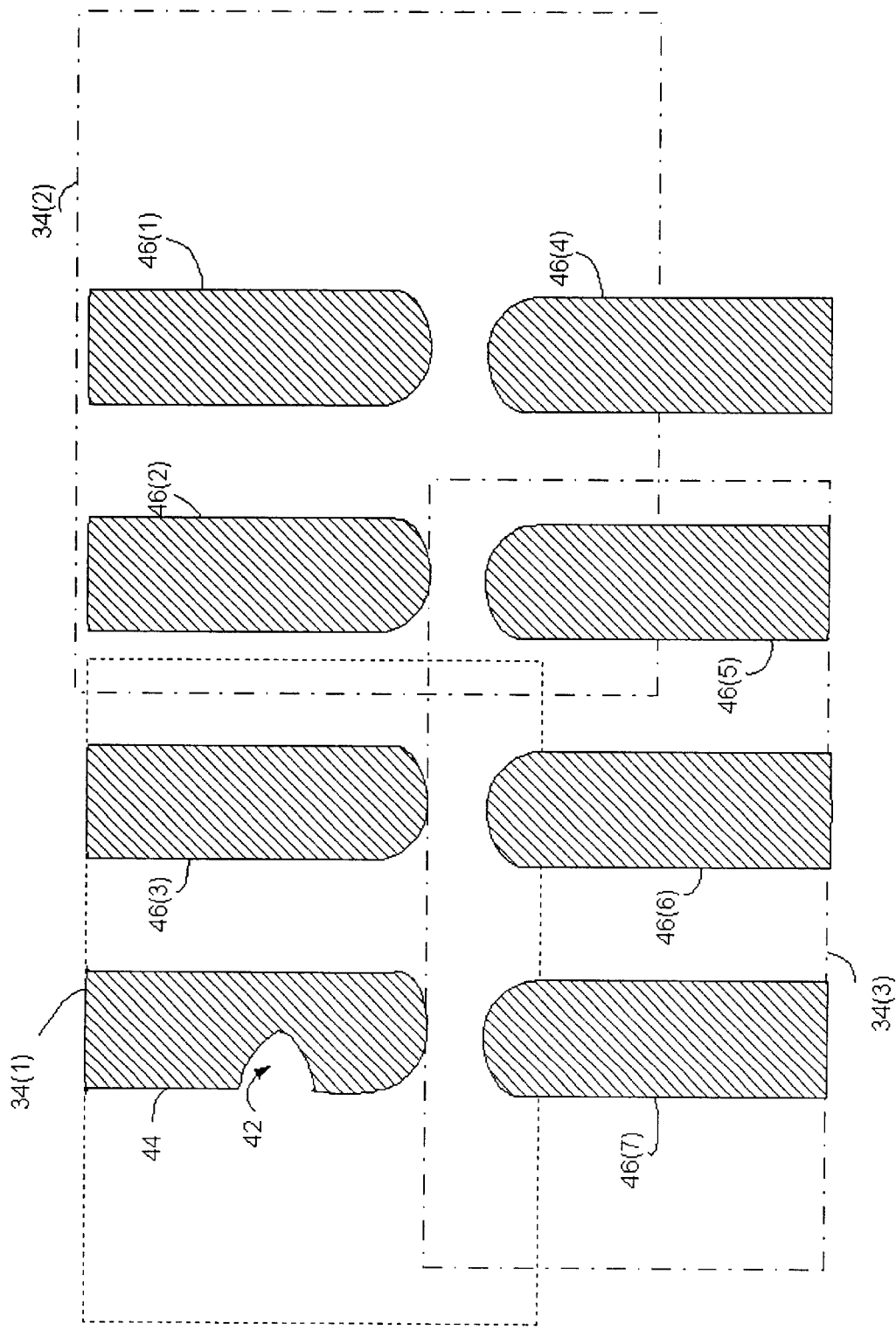
FIGS. 9 and 10 illustrate a portion of a surface of a die, before and after being processed by a first imager.
Figure 10:
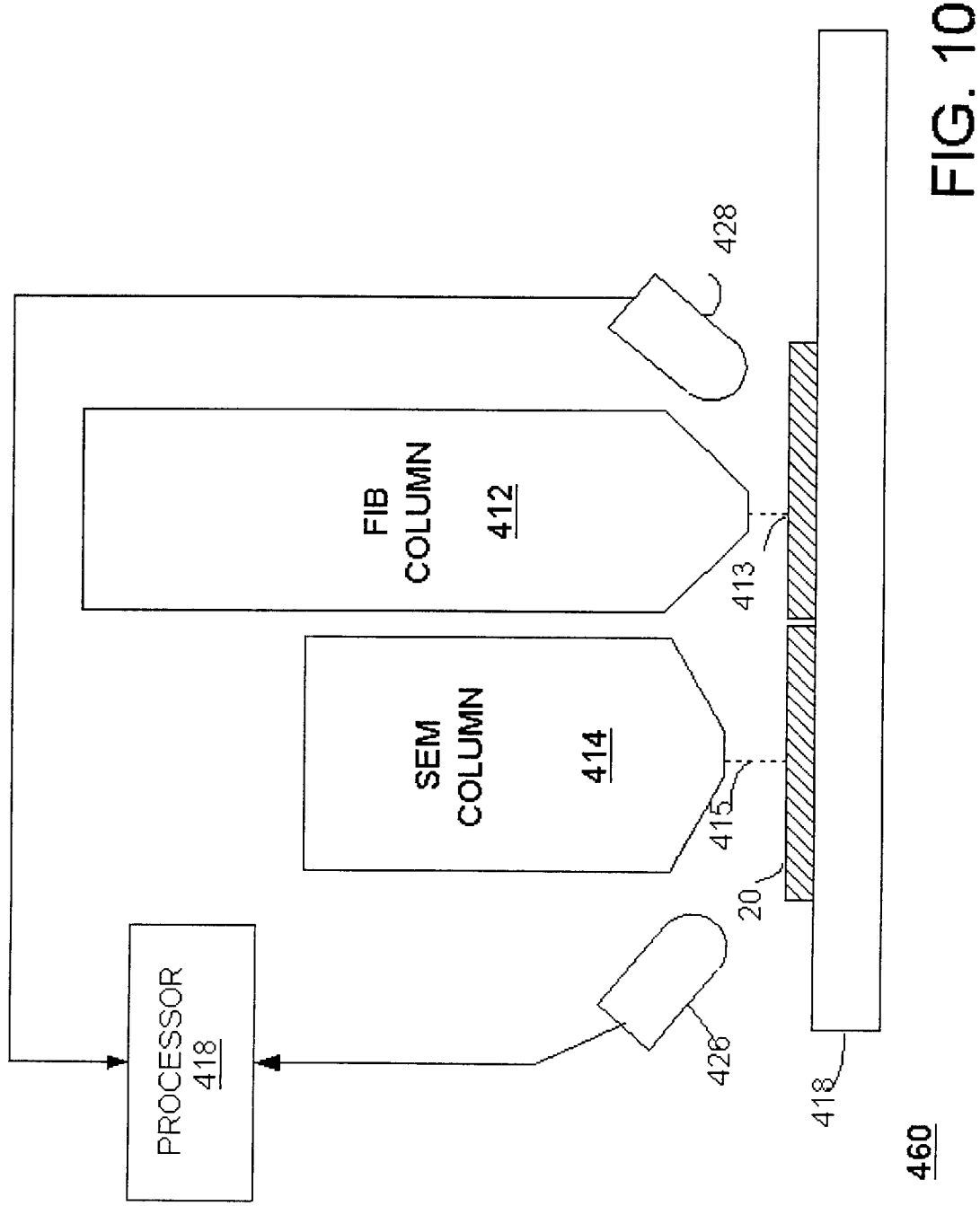
Figure 20:
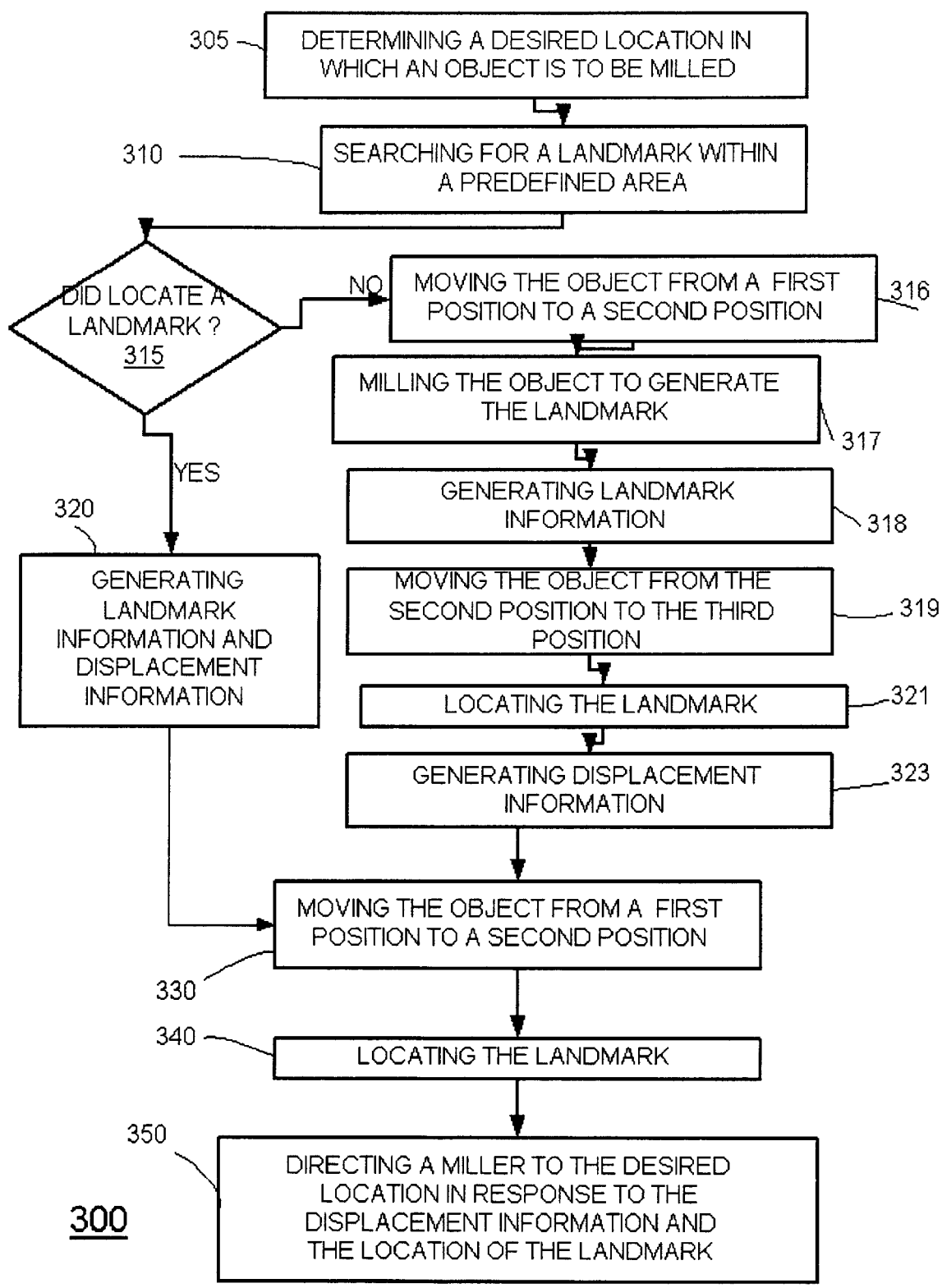

FIGS. 9 and 20 illustrate portion 48 of a surface of a die, before and after being processed by a first imager, according to an aspect of the invention. Portion 48 includes two lanes of conductors, 46(1)–46(7) and 44. Conductors 46(1)–46(7) are identical. Conductor 44 has a crater 42 that differentiates it from the other conductors. Crater 42 can be regarded as a landmark if (a) milling is required at a desired location that is located within a predefined area from crater 42 and, (b) the predefined area does not include another identical or substantially identical crater.

Conveniently, the size of the predefined area is responsive to expected inaccuracies of the stage movement. Images 34(1)–34(6) illustrate various images of distinct parts of portion 48. It is noted that image 34(1) includes crater 42.

The following examples will better illustrate the method for imaging and milling a die.

FIRST EXAMPLE

It is Assumed That (I.1) Milling is requires at a desired location at the vicinity of crater 42, as illustrated by "X" 52(8).

(I.2) A first imager, such as a first imager that includes SEM column 414, detector 426 and SEM processor 416 of FIG. 7, generated image 34(1) that includes crater 42.

(I.3) A second imager, such as a second imager that includes FIB column 412, detector 428 and FIB processor 417 of FIG. 7, generated an image, such as image 34(1) that also includes crater 42.

Then, a comparison between the location of crater 42 within image 34(1) and a displacement between crater 42 and "X" 52(8) are utilized to direct a miller, such as FIB column 412 of FIG. 7, to desired location "X" 52(8).

SECOND EXAMPLE

It is Assumed That (I.1) Milling is requires at a desired location at the vicinity of crater 42, as illustrated by "X" 52(8).

(I.2) A first imager, such as a first imager that includes SEM column 414, detector 426 and SEM processor 416 of FIG. 7, generated image 34(1) that includes crater 42.

(II.3) A second imager generates an image, such as image 34(2) that does not include crater 42.

Then, the second imager is operative to search crater 42 by scanning the portion 48 of die 32, generating images of parts of portion 48 and processing the images to locate crater 42. It is noted that the search area can be responsive to inaccuracies of a stage that supports and moves wafer 30 between SEM column 416 and FIB column 412.

THIRD EXAMPLE

It is Assumed That (III.1) Milling is requires at a desired location that is not at the vicinity of crater 42, as illustrated by "X" 52(1).

(III.2) A first imager generated image 34(2) that does not include crater 42.

(III.3) At the absence of a landmark, first imager is operative to generate add landmark to portion 48, such as landmark 50. Assuming the first imager includes SEM column 414, a landmark can be generated by aiming electron beam 415 to a single spot or to a relatively small area on the surface of object for a relatively long period. Electron beam 415 interacts with particles at the vicinity of die 32 or with an inserted/injected gas to generate landmark 50. It is noted that landmark 50 can be generated by various deposition techniques. It is noted that each landmark can have a predefined shape, as defined by a predefined scanning pattern of electron beam 415.

(III.4) A second imager generates an image, such as image 34(5) that also includes the landmark 50 just generated.

Then a comparison between the location of landmark 50 within images 34(2) and 34(5) and the displacement between the location of the landmark 50 and that of "X" 52(1) are used to direct a miller, such as focused ion beam generator 412 to desired location "X" 52(8). The displacement is previously calculated by processor 418 in response to the at least one SEM image of the landmark and the desired location.

FOURTH EXAMPLE

It is Assumed That (IV.1) Milling is required at a desired location that is not at the vicinity of crater 42, as illustrated by "X" 52(2).

(IV.2) A first imager generated image 34(2) that does not include crater 42.

(IV.3) At the absence of a landmark, the first imager is configured to search for a landmark, such as crater 42 by scanning portion 48 of die 32, generating images and processing the images to locate crater 42.

(IV.4) A second imager generates an image, such as image 34(2) that includes desired location 52(2) but does not include crater 42. The second imager is not aware that the image includes desired location 52(2) and has to search for crater 42.

Then, the second imager is operative to search crater 42 by scanning portion 48, generating images and processing the images to locate crater 42. It is noted that the search area can be responsive to inaccuracies of the stage.

FIFTH EXAMPLE

It is Assumed That (V.1) Milling is requires at a desired location that is not at the vicinity of crater 42, as illustrated by "X" 52(6).

(V.2) A first imager generated image 34(3) that does not include crater 42.

(V.3) At the absence of a landmark, the first imager is operative to generate a landmark, such as landmark 53, by at least one milling technique. Milling can be enhanced by injecting gas that interacts with electron beam. Usually, the milling capabilities of first imager are limited. For example, if SEM column 414 is utilized to generate landmark 53 by milling portion 48, the process is time consuming. SEM column 414 can mill portion 48 by aiming electron beam 415 to a single spot or to a relatively small area on the surface of object for a relatively long period. Electron beam 415 interacts with particles at the vicinity of die 32 or with an inserted/injected gas to generate landmark 53. It is noted that landmark 53 can be generated by various milling techniques. It is noted that each landmark can have a predefined shape, as defined by a predefined scanning pattern of electron beam 415.

(V.3) A second imager generates an image, such as image 34(6) that also includes landmark 53.

Then, a comparison between the location of landmark 53 within images 34(3) and 34(6) and a displacement between landmark 53 and "X" 52(6) are used to direct a miller to desired location "X" 52(8).

Figure 14:
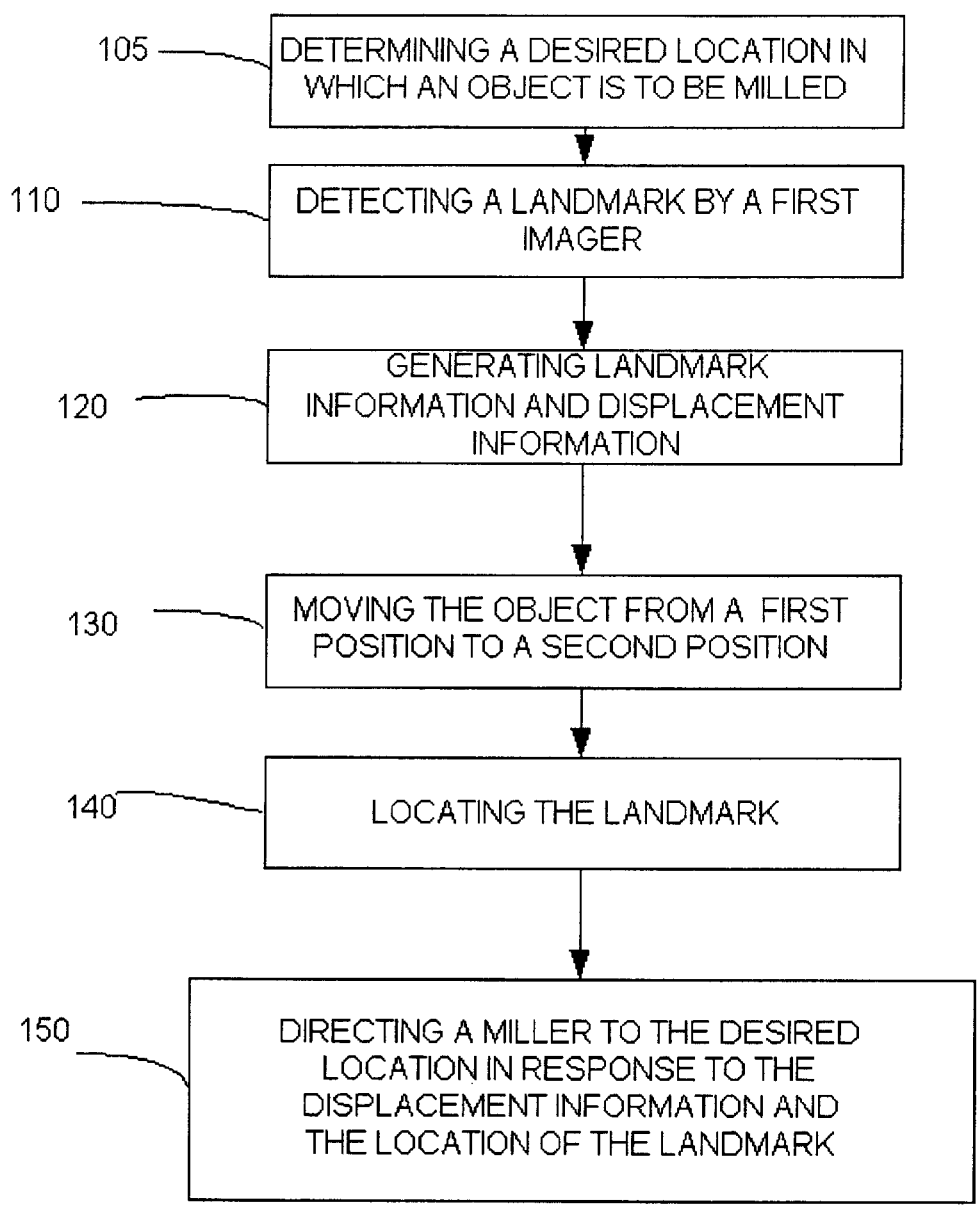
FIGS. 14, 15 and 20 are flow charts illustrating methods for directing a miller, such as FIB generator, according a various embodiments of the invention.

FIG. 14 is a flow chart of method 100 for directing a miller, according to an embodiment of the invention. Method 100 starts by step 105 of determining a desired location in which the object is to be milled. The desired location may be located near or even at a suspected defect or a defect, but this is not necessarily so. Step 105 is followed by step 110 of detecting a landmark. The detection process includes a step of generating images of a portion of the object, by a first imager. The step of generating the images starts by generating a first image of an area that includes the desired location. If the desired location and the landmark are included within that first image step 110 ends. Else, at least one additional image of at least another portion of the object is generated and the image is analyzed until a landmark is located. It is noted that the landmark can be located outside of an area that is defined by expected inaccuracies in the movement of the object. A landmark can include any shape that is unique within an inaccuracy area that includes the desired location, i.e.—it can be an intended feature or an unintended feature as long as it is sufficiently unique or infrequent in its surroundings. The size and shape of the inaccuracy area are responsive to accuracy limitation of a stage or other supporting means that support and move the object.

Figure 11:
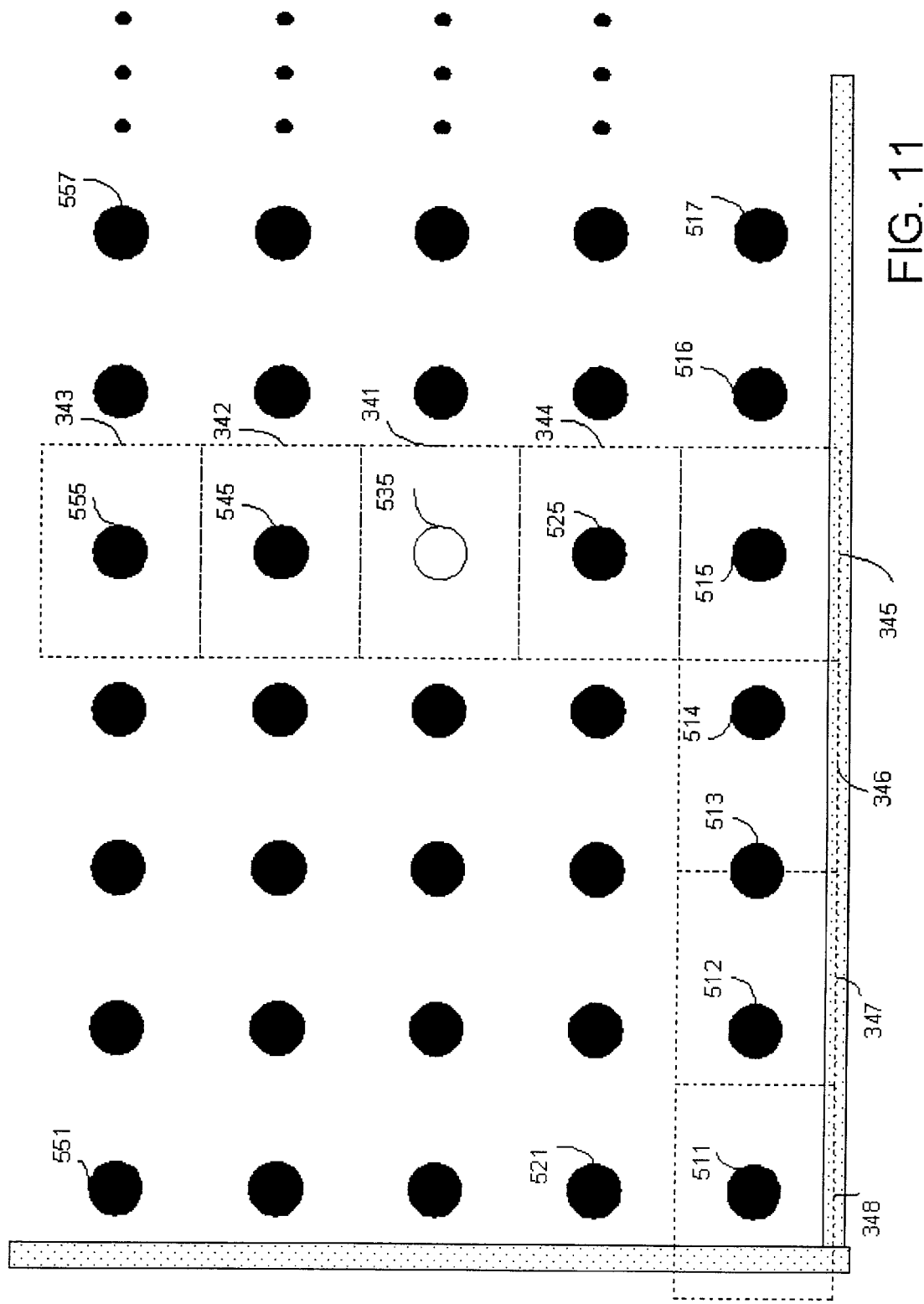
FIGS. 11–13 illustrate a portion of a surface of a die, before and after being processed by a first imager.
Figure 12:
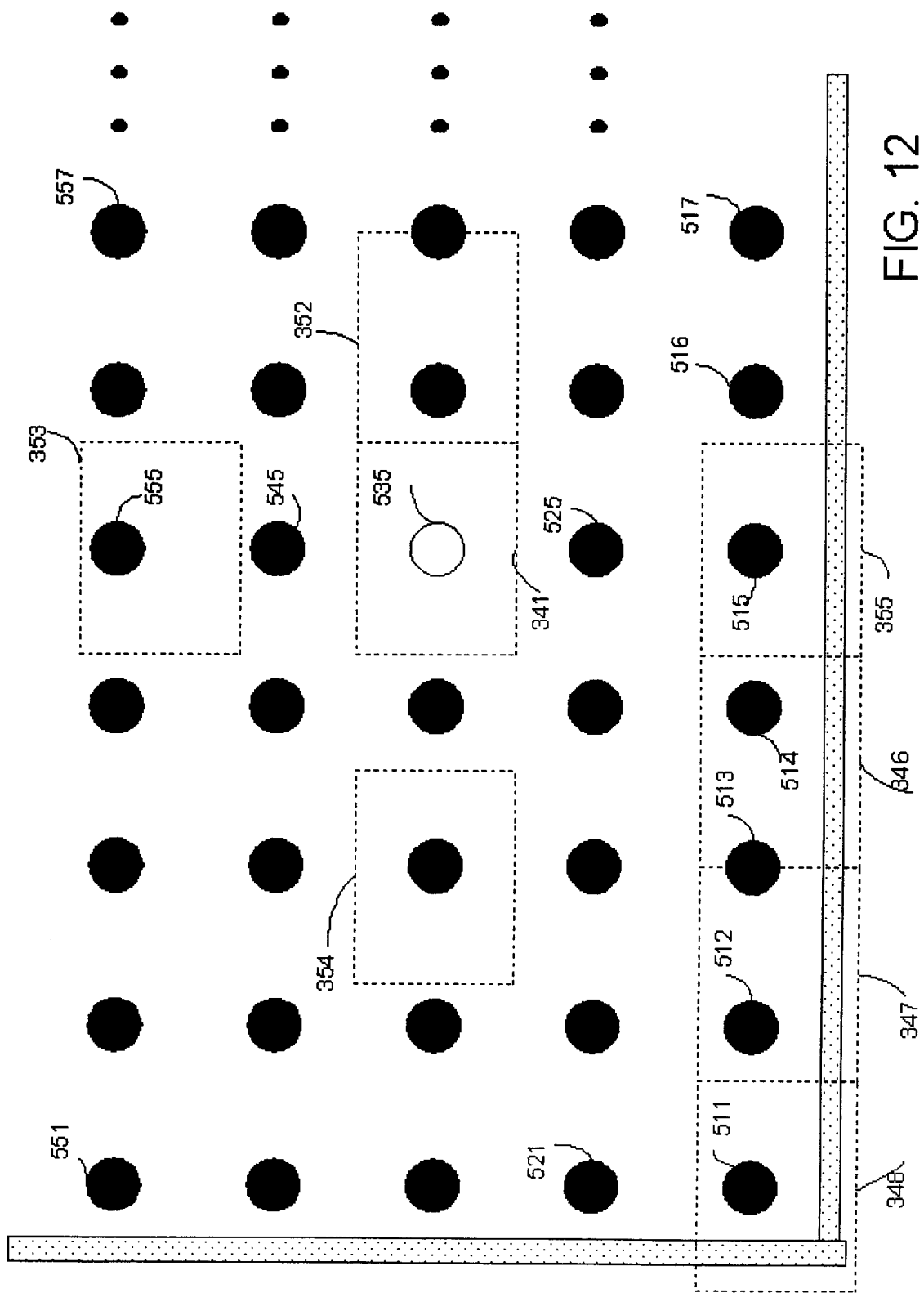

Referring now to the example set forth in FIGS. 4 and 11, conductor 535 that is a part of an array of ideally identical conductors, such as conductors 511–557, must be milled. A first SEM image 341 of conductor 535 does not include a landmark. Accordingly, a sequence of SEM images denoted 342–348 are generated and processed. SEM image 348 includes a landmark—a meeting point of a vertical line and a horizontal lint that defines an edge of the conductor array. FIG. 12 illustrates another scanning path that can be implemented to locate the landmark.

It is noted that step 110 can utilize portion information indicative of the expected image of portion 48. The portion information can be driven from previously generated SEM images, from CAD design information and the like. Referring to the example set forth at FIG. 12, the scanning step can utilize a portion information indicative that conductor 535 is located within a conductor array that is delimited by a vertical line and a horizontal line. Accordingly, when image 515 is processed and the horizontal line is located, the scanning continues along the horizontal line in order to find the meeting place of the vertical and horizontal line.

Step 110 is followed by step 120 of generating landmark information indicative of the landmark and displacement information reflecting a displacement between the landmark and the desired location. The landmark information can include visual and/or textual information. The visual information can include information representative of an image of the landmark, the landmark and its vicinity, a portion of the image that includes the landmark or the whole SEM image that includes the landmark. The landmark information also defines the location of the landmark. The textual information can include text that describes the landmark such that it can be identified by a second imager. It is noted that the displacement information can also include textual and/or visual information. Referring to the example set forth at FIG. 12, the displacement information can a include the distance and angular displacement between the landmark and conductor 535, but can also indicate that conductor 535 is the (5,3)'th conductor of the conductor array.

The landmark information and displacement information are stored or transmitted such that they may be retrieved during later steps of the process. Referring to the example set forth at FIG. 8, the landmark information and displacement information are both generated by processor 418 and stored at a location that allows processor 418 to retrieve them. Referring to the example set forth at FIG. 7, the landmark information and displacement information are generated by SEM processor 416 and transmitted to FIB processor 417 to be stored at a location that allows FIB processor 417 to retrieve them.

It is noted that step 110 or 120 can further include a step of generating desired location information. The desired location information can be utilized for verifying that the miller is directed to the desired location. The desired location information can also include visual and/or textual information.

Step 120 is followed by step 130 of moving the object from a first location in which the object is accessible to the first imager to a second location in which the object is accessible to a miller. The movement is responsive to the landmark information such that the miller is initially directed to an inaccuracy area that includes the landmark. Referring to the example set forth at FIG. 7, object 21 is moved by stage 20, from a first location in which portion 48 can be accessed by electron beam 415 to a second location in which portion 48 can be accessed by focused ion beam 413.

Figure 13:
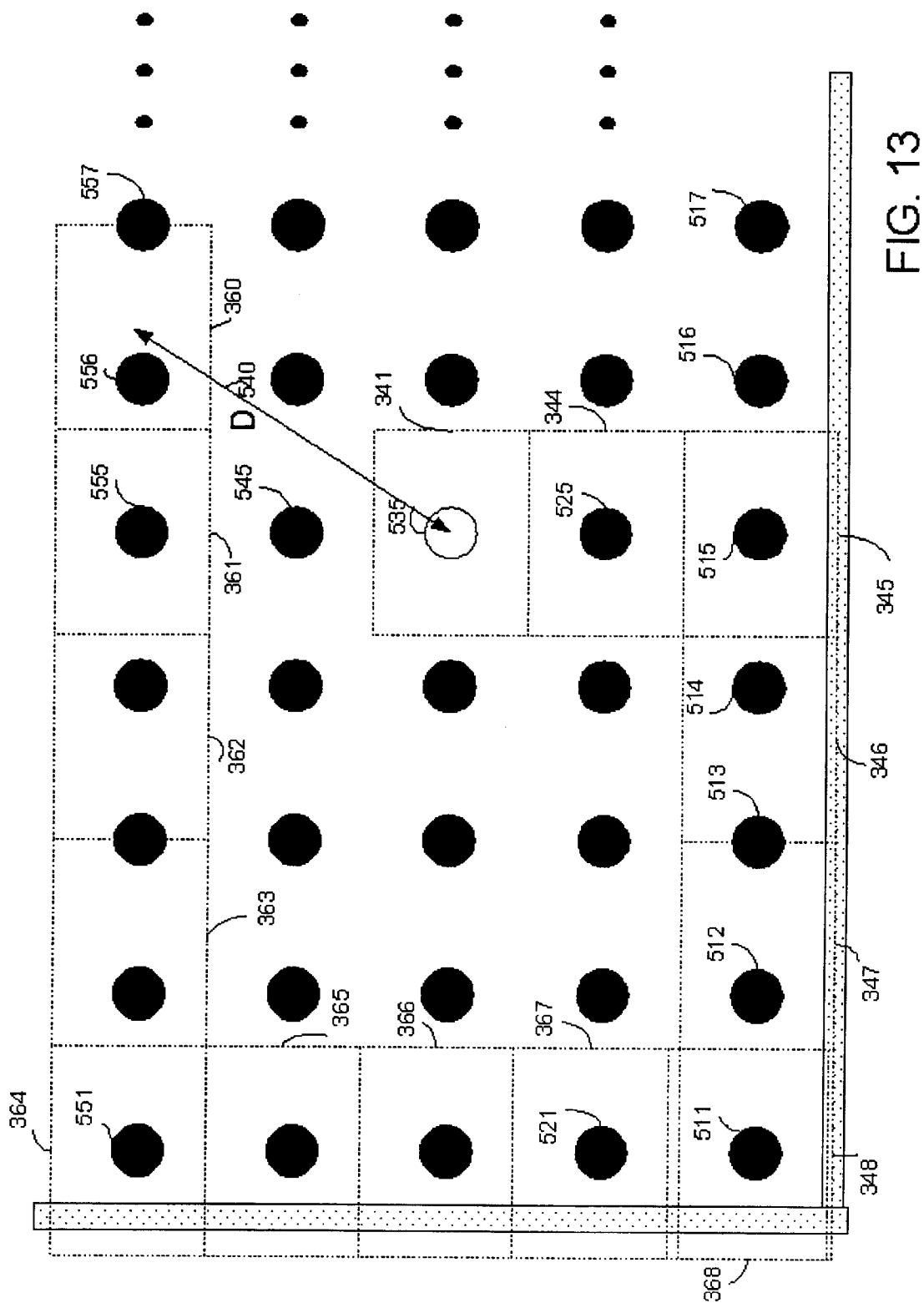

Step 130 is followed by step 140 of locating the landmark. Step 140 may include generating images of a portion of the object, starting at a first image of at least a portion of the inaccuracy area that includes the landmark. These images were generated by second imager. If the first image generated by the second imager includes the landmark then step 140 ends. Else, else additional images of portions of the inaccuracy area are taken and analyzed until the landmark is located. Referring to the example set forth at FIG. 13, step 140 starts by generating FIB image 360 that does not include landmark. The FIB image is processed and is followed by a step of generating and processing FIB images 361–368. FIB image 368 includes the landmark (the meeting point of the vertical and horizontal lines).

Step 140 is followed by step 150 of directing the miller to the desired location in response to the displacement information and the location of the landmark, as detected during step 140. This is possible because the FIB beam and SEM beam 413 and 415 are aligned to a common point on die 32 and the displacement information of the SEM column is equally applicable to the FIB column. Referring to the example set forth at FIG. 13, after the landmark is located the miller is directed to conductor 353 in response to the displacement information. Step 150 can also include a verification of the direction by generating a FIB image of conductor 535 and processing the FIB image in view of the desired location information.

Step 140 can include at least one of the following steps: a compensation step such as step (A) of angle compensation, step (B) of imaging process variation compensation, and (I.II) correlation step.

Figure 15:
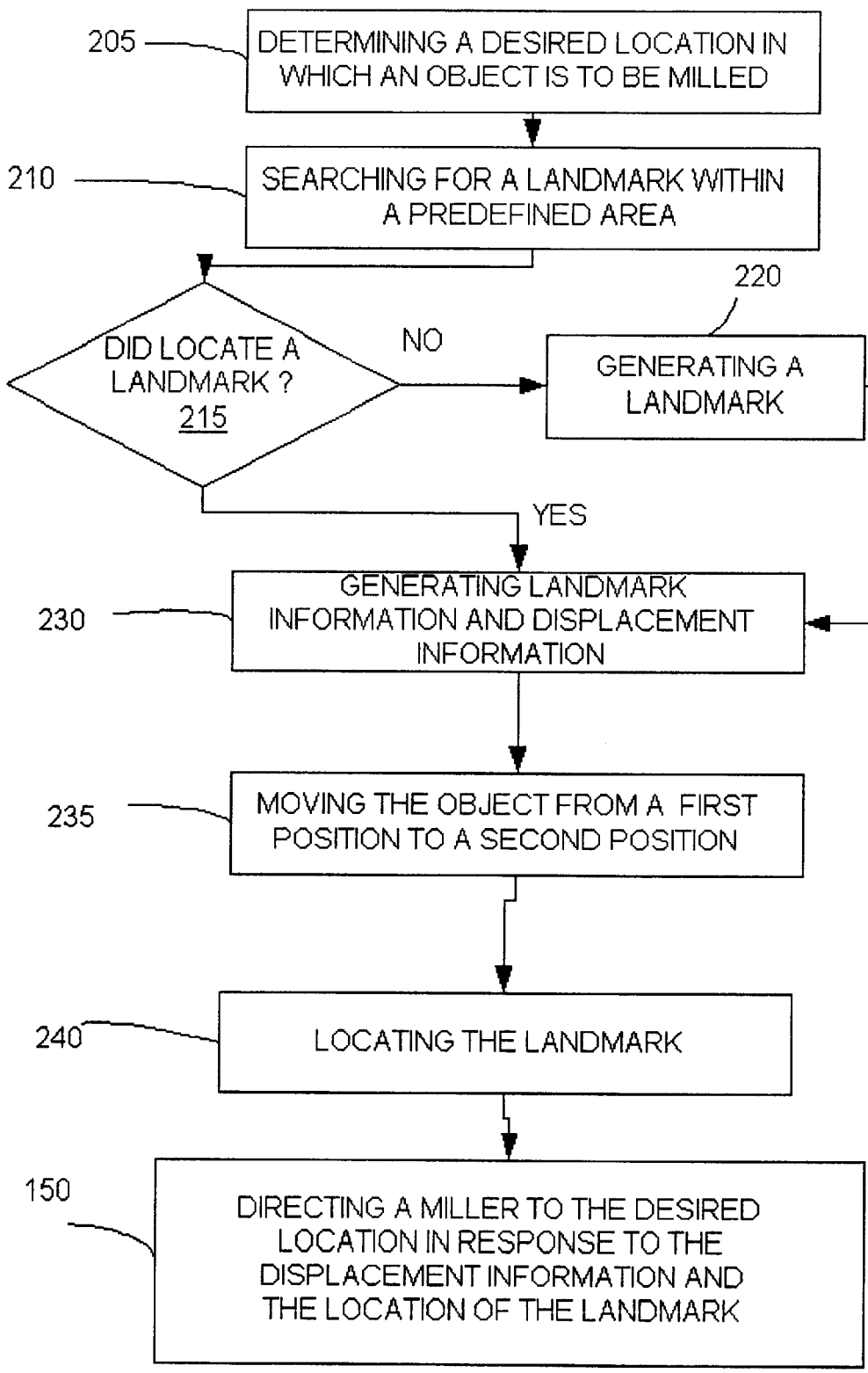

FIG. 15 is a flow chart of method 200 for directing a miller, according to an embodiment of the invention.

Method 200 starts by step 205 of determining a desired location in which the object is to be milled. The desired location may be located near or even at a suspected defect or a defect, but this is not necessary. Step 205 is followed by step 210 of searching for a landmark within a predefined area. The predefined area is characterized by at least one predefined criteria such as size, shape, location and the like. As illustrated by query step 215, if the landmark is found step 210 is followed by step 230, else it is followed by step 220. The predefined area usually is smaller in size than the inaccuracy area that includes the desired location.

It is noted that step 220 of generating a landmark can utilize various milling, etching or deposition techniques. Assuming that the landmark is generated by a first image that includes a SEM, the landmark can be generated by an interaction between a material located at the vicinity of the object and the electron beam that is utilized to generate the SEM image. The electron beam can interact with particles within a vacuum chamber in which the object is located. This electron beam usually carbonizes these particles and carbon molecules are piled to generate the landmark. The predefined area can be limited to the vicinity of the desired location but this is not necessary. The landmark generation can be accelerated by injecting gases to the vicinity of the electron beam or even to the vicinity of the desired location and allow the gases to interact with the electron beam. The gases can result in either etching the object at the vicinity of the desired location or in a deposition of material at the vicinity of the desired location. It is noted that the characteristics of the landmark, such as height or depth can be controlled either automatically or manually to assure that the landmark can be located during further steps of method 200. For example, the characteristics of the landmark can be determined in response to the surface characteristics of the object or of an area of the object at the vicinity to the unique mark. These characteristics can include surface roughness, surface flatness, and the like. Step 220 is followed by step 230.

Step 230 includes generating landmark information indicative of the landmark and displacement information reflecting a displacement between the landmark and the desired location.

Step 230 is followed by step 235 of moving the object from a first location in which the object is accessible to the SEM to a second location in which the object is accessible to a miller.

Step 235 is followed by step 240 of locating the landmark.

Step 240 is followed by step 250 of directing the miller to the desired location in response to the displacement information and the location of the landmark, as detected during step 240.

Figure 16:
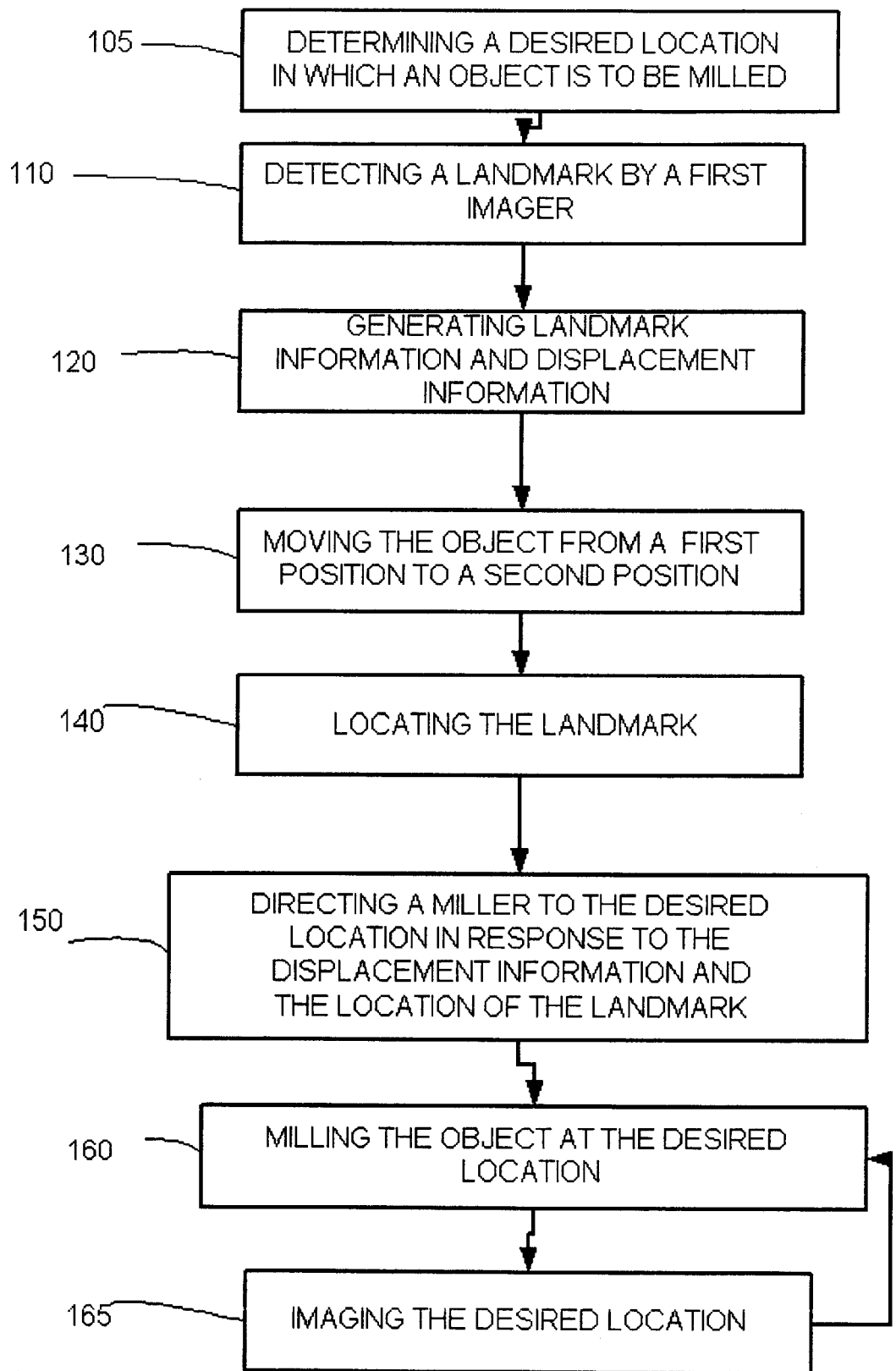
FIGS. 16 and 18 are flow charts illustrating methods for directing a miller, according to embodiments of the invention.

FIG. 16 is a flow chart of a method 155 for milling an object, according to an aspect of the invention. Method 155 is analogues to method 100 but step 140 is followed by step 160 of milling the object at the desired location. Step 160 can be followed by step 165 of generating an image of the desired location and its vicinity. It is noted that steps 160 and 165 can be repeated to allow for monitoring the step of milling.

Figure 17:
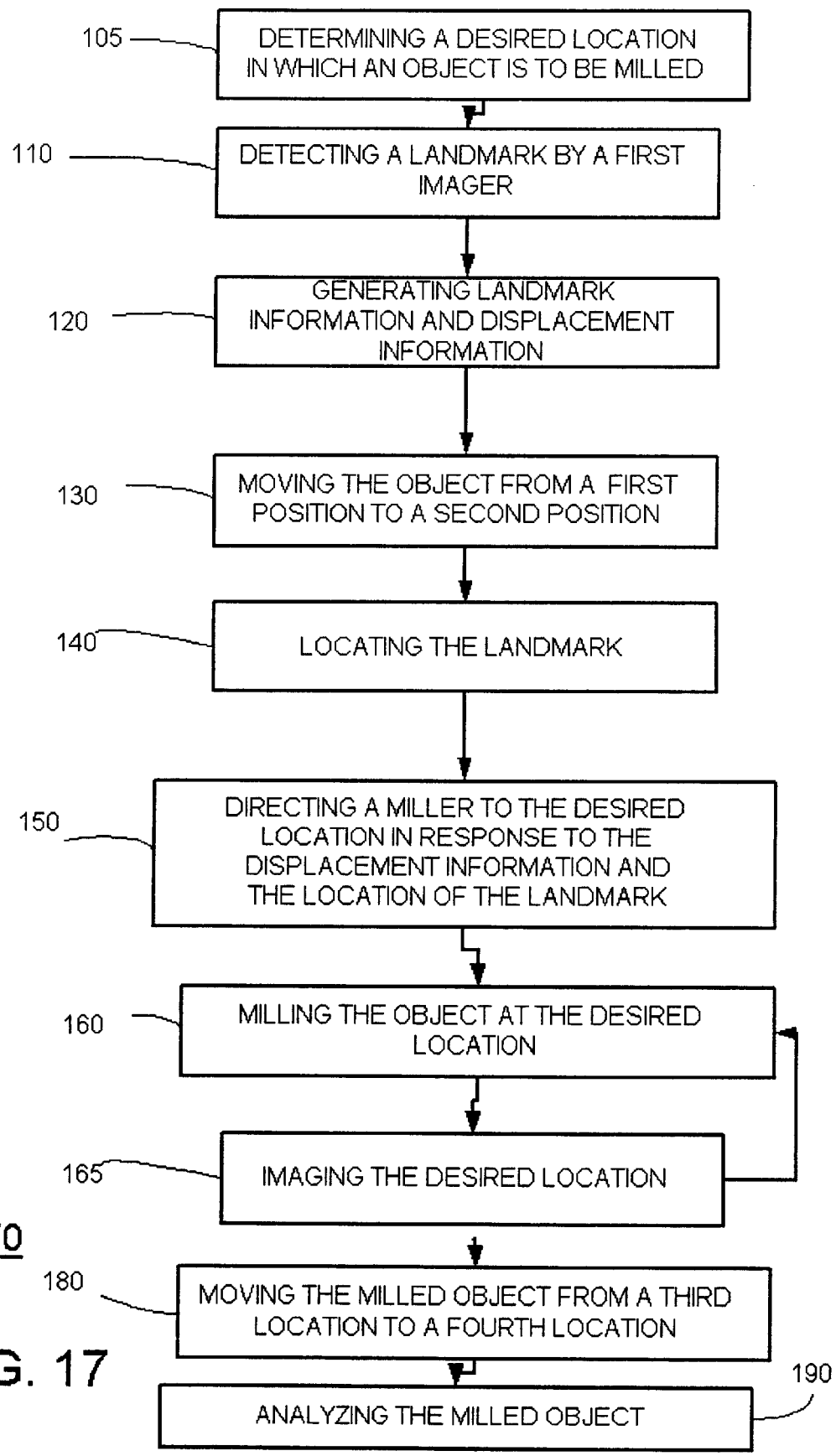
FIGS. 17 and 19 are flow charts illustrating methods for detecting and analyzing defect, according to an aspect of the invention.

FIG. 17 is a flow chart of method 170 for detecting and analyzing defect, according to an aspect of the invention. Method 170 is analogues to method 155 but includes step 180 of moving the object from the third location in which the object is accessible to the miller to a fourth location in which the object, and especially the desired location is accessible to the first imager. Step 180 is followed by step 190 of analyzing the cross sectioned or milled object.

Figure 18:
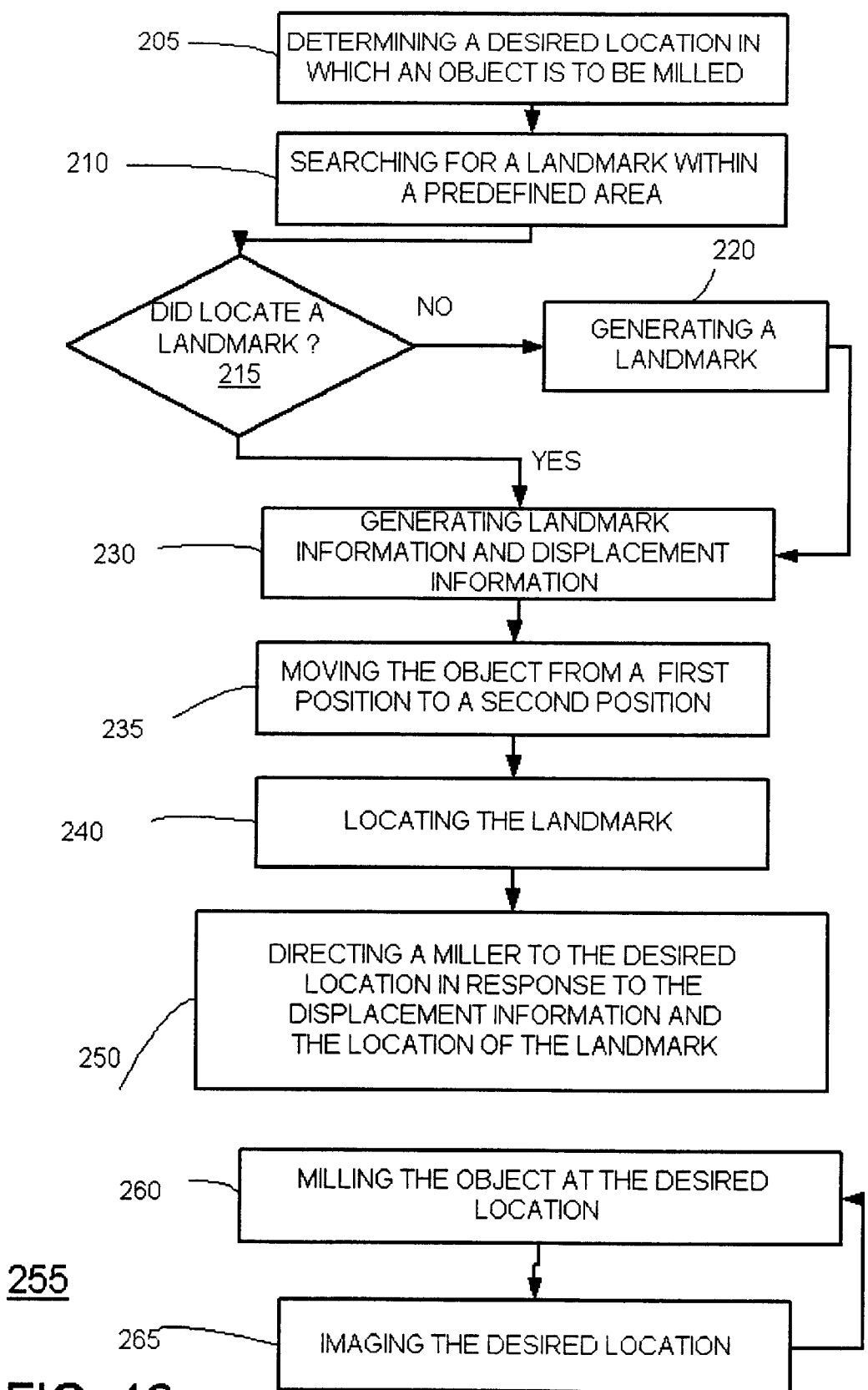

FIG. 18 is a flow chart of a method 255 for milling an object, according to an aspect of the invention. Method 255 is analogues to method 200 but step 240 is followed by step 260 of milling the object at the desired location. Step 260 can be followed by step 265 of generating an image of the desired location and its vicinity. It is noted that steps 260 and 265 can be repeated to allow for monitoring the step of milling.

Figure 19:
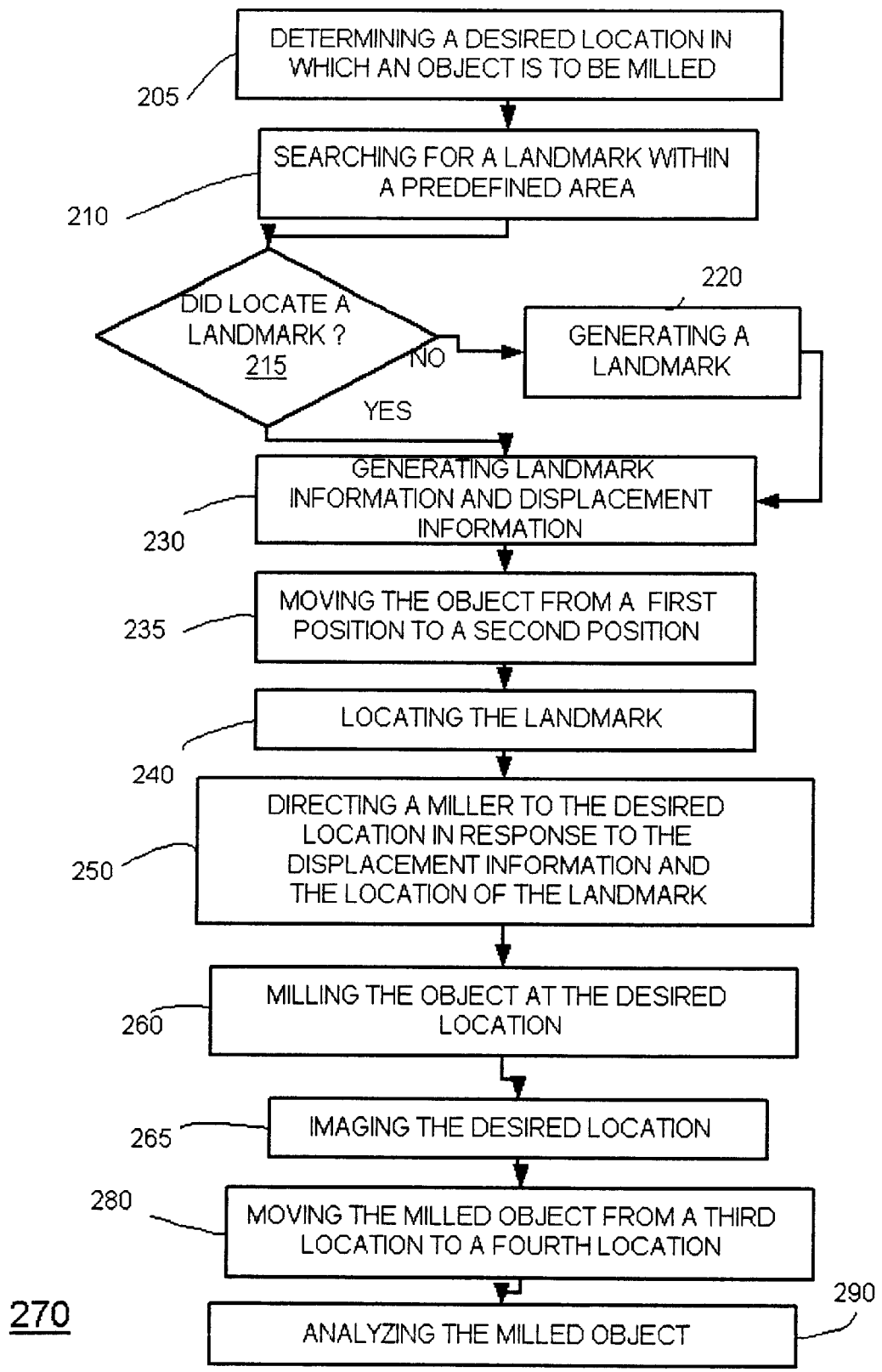

FIG. 19 is a flow chart of method 270 for detecting and analyzing defect, according to an aspect of the invention. Method 270 is analogues to method 255 but includes additional steps 280 and 290. Step 280 including moving the object from the third location in which the object is accessible to the miller to a fourth location in which the object, and especially the desired location is accessible to the first imager. It is noted the third location can be equal to the second location, and that the fourth location can be equal to the first location.

Step 280 is followed by step 290 of analyzing the cross-sectioned or milled object.

FIG. 20 is a flow chart of method 300 for directing a miller, according to an embodiment of the invention.

Method 300 starts by step 305 of determining a desired location in which the object is to be milled. The desired location may be located near or even at a suspected defect or a defect, but this is not necessary. Step 305 is followed by step 310 of searching for a landmark within a predefined area. The predefined area is characterized by at least one predefined criteria such as size, shape, location and the like. Step 310 is followed by query step 315 "did locate landmark ?". If a landmark was located step 315 is followed by step 320 of generating landmark information and displacement information. Sep 320 is followed by step 330. If a landmark was not located step 315 is followed by step 316 of moving the object from a first location in which the object is accessible to the first imager to a second location in which the object is accessible to the miller. Step 316 is followed by step 317 of milling the object to generate a landmark. Step 317 is followed by step 318 of generating landmark information. Step 318 is followed by step 319 of moving the object from the first location to the second location. Step 319 is followed by step 321 of locating the landmark. Step 321 is followed by step 323 of generating displacement information. Step 323 is followed by step 330.

It is noted that step 317 of milling the object can utilize various milling or etching techniques. Assuming that the landmark is generated by a focused ion beam generator, the landmark can be generated by an interaction between a the object and the focused ion beam. The milling can be enhanced by injecting gases to the vicinity of the electron beam or even to the vicinity of the desired location and allow the gases to interact with the electron beam. It is noted that the characteristics of the landmark, such as height or depth can be controlled either automatically or manually to assure that the landmark can be located during further steps of method 300. For example, the characteristics of the landmark can be determined in response to the surface characteristics of the object or of an area of the object at the vicinity to the unique mark. These characteristics can include surface roughness, surface flatness, and the like.

Step 330 includes generating landmark information indicative of the landmark and displacement information reflecting a displacement between the landmark and the desired location.

Step 330 is followed by step 335 of moving the object from a first location in which the object is accessible to the SEM to a second location in which the object is accessible to a miller.

Step 335 is followed by step 340 of locating the landmark.

Step 340 is followed by step 350 of directing the miller to the desired location in response to the displacement information and the location of the landmark, as detected during step 340.

It is noted that method 300 may have additional steps such as step that are analogues to steps 160, 260, 165, 265, 180, 280, 190 and 290, such that the object can be milled at the desired location and the milled object can further be analyzed to locate defects.

It will be apparent to those skilled in the art that the disclosed subject matter may be modified in numerous ways and may assume many embodiments other then the preferred form specifically set out and described above.

Accordingly, the above disclosed subject matter is to be considered illustrative and not restrictive, and to the maximum extent allowed by law, it is intended by the appended claims to cover all such modifications and other embodiments, which fall within the true spirit and scope of the present invention.

The scope of the invention is to be determined by the broadest permissible interpretation of the following claims and their equivalents rather then the foregoing detailed description.

What is claimed is:

1. A system for directing a miller, the system comprising:
   a first imager, aligned so as to have a first scanning area for locating a landmark on an die when the die is positioned in a first location;
   a stage, for moving the die from the first location in which the die is accessible to the first imager to a second location in which the die is accessible to a miller; and
   a second imager, aligned so as to have a second scanning area distant from the first scanning area for directing a miller to mill the die at the desired location;
   wherein the first imager comprises a scanning electron microscope comprising a SEM column, at least one detector and at least one processor operable to generate SEM images of the die.

2. The system of claim 1 wherein the second imager is operative to locate the landmark and to direct the miller to mill at the desired location in response to landmark information and displacement information.

3. The system of claim 1 wherein the second imager is operative to generate at least one image of at least one portion of the die and to locate the landmark in response to an analysis of the at least one image of the at least one portion.

4. The system of claim 1 wherein the second imager is operative to generate at least one image of at least one portion of the die and to locate the landmark in response to a comparison between a first image that includes the landmark and the at least one image of the at least one portion, the first image being generated by the first imager.

5. The system of claim 1 further comprising the miller.

6. The system of claim 5 wherein the second imager and the miller comprise a focused ion beam generator.

7. The system of claim 6 wherein the focused ion beam generator comprises a focused ion beam column, at least one detector and a processor, the processor being operable to generate focused ion beam images of the die, to locate the landmark and to direct the miller.

8. The system of claim 5 further comprising a gas injection unit for providing gas that interacts with a focused ion beam to mill the die.

9. The system of claim 5 wherein the first imager and the miller are spaced apart.

10. The system of claim 5 wherein the distance between the first imager and the miller exceeds 10 mm.

11. The system of claim 5 wherein the stage is operative to place the die at a small working distance from the miller and at a small working distance from the first imager.

12. The system of claim 11 wherein the sum of the small working distance from the miller and the small working distance from the first imager does not exceed 15 mm.

13. The system of claim 11 wherein the sum of the small working distance from the miller and the small working distance from the first imager does not exceed 5 mm.

14. The system of claim 1 wherein the system is operative to execute a step of angle compensation, for correcting differences between images generated by the first imager and the second imager, the differences were having been introduced because the images were generated from different angles.

15. The system of claim 1 wherein the system is operative to execute a step of imaging process variation compensation, for correcting differences between images generated by the first imager and the second imager, the differences having been introduced because the images were generated by distinct image generation processes.

16. The system of claim 1 wherein the system is operable to execute a step of determining a landmark group of pixels of an image generated by the first imager and to execute a correlating step for determining a correlation between the landmark group of pixels and pixels of an image generated by the second Imager.

17. The system of claim 1 wherein the first imager is operative to generate the landmark.

18. The system of claim 17 wherein the first imager is operative to generate the landmark by adding particles to the die.

19. The system of claim 17 wherein the first imager is a scanning electron microscope operative to generate an electron beam.

20. The system of claim 19 further comprising a gas injection unit for providing a gas that interacts with the electron beams to generate the landmark.

21. The system of claim 19 wherein the scanning electron microscope is operable to mill the die.

22. The system of claim 19 wherein the scanning electron microscope is operable to generate the landmark by deposition.

23. A system for defect analysis, the system comprising:
   a scanning electron microscope, for generating SEM images and locating a landmark on an object;
   a focused ion beam miller and imager, for locating the landmark on the object and milling the object at a desired location; and
   a stage, for moving the object from a first location in which the object is accessible to a first scanning area of the scanning electron microscope to a second location in which the object is accessible to a second scanning area of the focused ion beam miller and imager that is distant from the first scanning area.

24. The system of claim 23 wherein the focused ion beam miller and imager is operative to locate the landmark and to mill at the desired location in response to landmark information and displacement information.

25. The system of claim 23 wherein the focused ion beam miller and imager is operative to generate at least one image of at least one portion of the object and to locate the landmark in response to an analysis of the at least one image of the at least one portion.

26. The system of claim 23 wherein the focused ion beam miller and imager is operative to generate at least one image of at least one portion of the object and to locate the landmark in response to a comparison between a first image that includes the landmark and the at least one image of the at least one portion, the first image being generated by the scanning electron microscope.

27. The system of claim 23 wherein the scanning electron microscope comprises a SEM column, and the focused ion beam miller and imager comprises a FIB column.

28. The system of claim 27 wherein the FIB column and the SEM column are spaced apart.

29. The system of claim 27 wherein the distance between the FIB column and the SEM column exceeds 10 mm.

30. The system of claim 27 wherein the stage is operative to place the object at a small working distance from the FIB column and at a small working distance from the SEM column.

31. The system of claim 30 wherein the sum of the small working distance from the FIB column and the small working distance from the SEM column does not exceed 15 mm.

32. The system of claim 30 wherein the sum of the small working distance from the FIB column and the small working distance from the SEM column does not exceed 5 mm.

33. The system of claim 23 wherein the system is operative to execute a step of angle compensation, for correcting differences between images generated by the scanning electron microscope and the focused ion beam miller and imager, the differences having been introduced because the images were generated from different angles.

34. The system of claim 23 wherein the system is operative to execute a step of imaging process variation compensation, for correcting differences between images generated by the scanning electron microscope and the focused ion beam miller and imager, the differences having been introduced because the images were generated by distinct image generation processes.

35. The system of claim 23 wherein the system is operable to execute a step of determining a landmark group of pixels of an image generated by the scanning electron microscope and to execute a correlating step for determining a correlation between the landmark group of pixels and pixels of an image generated by the focused ion beam miller and imager.

36. The system of claim 23 further comprising a gas injection unit for providing a gas that interacts with electron beams produced by the scanning electron microscope to generate the landmark.

37. The system of claim 23 wherein the scanning electron microscope is operable to mill the die.

38. The system of claim 23 wherein the scanning electron microscope is operable to generate the landmark by deposition.

39. The system of claim 23 further comprising a gas injection unit for providing gas that interacts with a focused ion beam produced by the focused ion beam miller and imager to mill the object.

40. A method for directing a miller, the method comprising the steps of:
    determining a desired location in which an object is to be milled;
    detecting a landmark by a first imager having a first scanning area;
    moving the object from a first location in which the object is accessible to the first imager to a second location in which the object is accessible to the miller, which has a second scanning area distant from the first scanning area;
    locating the landmark; and directing the miller to the desired location in response to landmark information and displacement information being generated by the first imager in response to the detection of the landmark;
    wherein the first imager comprises a scanning electron microscope.

41. The method of claim 40 wherein the step of detecting the landmark comprises generating at least one image of at least one portion of the object.

42. The method of claim 41 wherein the step of generating at least one image comprises repeating the steps of generating an image and analyzing the image to locate the landmark until the landmark is located.

43. The method of claim 41 wherein the detection of the landmark is responsive to portion information indicative of an expected image of the at least one portion of the object.

44. The method of claim 43 wherein the portion information is derived from at least one member of the group consisting of: previously generated SEM images and CAD design information.

45. The method of claim 40 wherein the landmark information includes textual information describing the landmark.

46. The method of claim 40 wherein the landmark information comprises visual information representative of at least one of the members of the group consisting of: the landmark; the landmark and a vicinity of the landmark.

47. The method of claim 40 wherein the landmark information is indicative of a location of the landmark.

48. The method of claim 40 further comprising a step of generating a desired location information, indicative of the desired location.

49. The method of claim 48 further comprising a step of utilizing the desired location information to verify that the miller is directed to the desired location.

50. The method of claim 40 wherein the step of moving the object is responsive to the landmark information such that the miller is initially directed to an inaccuracy area that includes the landmark.

51. The method of claim 40 wherein the step of locating the landmark comprises generating at least one image of at least one portion of the object and analyzing the at least one image in response to the landmark information.

52. The method of claim 40 wherein the step of locating the landmark comprises comparing at least one image of at least a portion of the landmark, as generated by the first imager, with at least one image generated by a second imager.

53. The method of claim 52 further comprising a step of angle compensation.

54. The method of claim 52 further comprising a step of imaging process variation compensation.

55. The method of claim 52 further comprising a correlation step.

56. A method for directing a miller, the method comprising the steps of:
    determining a desired location in which an object is to be milled;
    searching for a landmark within a predefined area that includes the desired location using a first imager having a first scanning area;
    generating a landmark if a an existing landmark is not detected within the predefined area;
    moving the object from a first location in which the object is accessible to the first imager to a second location in which the object is accessible to t-lie a miller having a second scanning area distant from the first scanning area;
    locating the landmark; and directing the miller to the desired location in response to landmark information and displacement information being generated by the first imager in response to the detection of the landmark;
    wherein the first imager comprises a scanning electron microscope.

57. The method of claim 56 wherein the landmark is generated by milling the object.

58. The method of claim 56 wherein the landmark is generated by depositing material on the object.

59. The method of claim 56 wherein the landmark is generated by the first imager.

60. The method of claim 56 wherein the landmark is generated by an interaction of an electron beam, generated by the scanning electron microscope and the object.

61. The method of claim 56 wherein the landmark is generated by an interaction of the electron beam with particles that are located at the vicinity of the object.

62. The method of claim 56 further comprising a step of injecting gas such that the gas particles interact with the electron beam to generated the landmark.

63. The method of claim 56 wherein the step of generating a landmark includes a step of controlling at least one characteristic of the landmark.

64. The method of claim 63 wherein the at least one characteristic is responsive to characteristics of the object.

65. The method of claim 64 wherein the at least one characteristic is selected from the group consisting of: surface roughness, surface flatness and surface composition.

66. A method for milling an object, the method comprising the steps of:
    determining a desired location in which an object is to be milled;
    searching for a landmark within a predefined area that includes the desired location using a first imager having a first scanning area;

generating a landmark if a an existing landmark is not detected within the predefined area;

moving the object from a first location in which the object is accessible to the first imager to a second location in which the object is accessible to tke a miller having a second scanning area distant from the first scanning area;

locating the landmark; directing the miller to the desired location in response to landmark information and displacement information being generated by the first imager in response to the detection of the landmark; and milling the object at the desired location;

wherein the first imager comprises a scanning electron microscope.

67. A method for milling an object, the method comprising the steps of:

determining a desired location in which an object is to be milled;

detecting a landmark by a first imager having a first scanning area;

moving the object from a first location in which the object is accessible to the first imager to a second location in which the object is accessible to t-he a miller having a second scanning area distant from the first scanning area;

locating the landmark;

directing the miller to the desired location in response to landmark information and displacement information being generated by the first imager in response to the detection of the landmark; and milling the object;

wherein the first imager comprises a scanning electron microscope.

68. A method for inspecting an object, the method comprising the steps of:

determining a desired location in which an object is to be milled;

detecting a landmark by a first imager having a first scanning area;

moving the object from a first location in which the object is accessible to the first imager to a second location in which the object is accessible to the a miller having a second scanning area distant from the first scanning area;

locating the landmark; directing the miller to the desired location in response to landmark information and displacement information being generated by the first imager in response to the detection of the landmark; and milling the object to provide a milled object;

moving the milled object from the second location to the first location; and generating information reflecting the milled object;

wherein the first imager comprises a scanning electron microscope.

69. A method for inspecting an object, the method comprising the steps of:

determining a desired location in which an object is to be milled;

earching for a landmark within a predefined area that includes the desired location using a first imager having a first scanning area;

generating a landmark if a an existing landmark is not detected within the predefined area;

moving the object from a first location in which the object is accessible to the first imager to a second location in which the object is accessible to the a miller having a second scanning area distant from the first scanning area;

locating the landmark;

directing the miller to the desired location in response to landmark information and displacement information being generated by the first imager in response to the detection of the landmark;

milling the object to provide a milled object;

moving the milled object from the second location to the first location; and generating information reflecting the milled object;

wherein the first imager comprises a scanning electron microscope.

70. A method for milling an object, the method comprising the steps of:

(a) determining a desired location in which an object is to be milled;

(b) searching for a landmark within a predefined area that includes the desired location usin.2 a first imager having a first scanning area; jumping to a step (g) if a the landmark is net detected;

(c) moving the object from a first location in which the object is accessible to the first imager to a second location in which the object is accessible to the a miller having a second scanning area distant from the first scanning area, if the landmark was not detected within the predefined area;

(d) generating a new landmark by milling the object and generating landmark information indicative of the new landmark;

(e) moving the object from the second location to the first location;

(f) locating the landmark and generating displacement information;

(g) moving the object from the first location to the second location; and (h) detecting the landmark and directing the miller to the desired location in response to the displacement information;

wherein the first imager comprises a scanning electron microscope.

71. The method of claim 70 wherein the step of searching for a landmark comprises generating at least one image of at least one portion of the object.

72. The method of claim 71 wherein the step of generating at least one image comprises repeating the steps of generating an image and analyzing the image to locate the landmark.

73. The method of claim 70 wherein the landmark information includes textual information describing the landmark.

74. The method of claim 70 wherein the landmark information comprises visual information representative of at least one of the members of the group consisting of: the landmark; the landmark and a vicinity of the landmark.

75. The method of claim 70 wherein the landmark information is indicative of a location of the landmark.

76. The method of claim 70 further comprising a step of generating a desired location information, indicative of the desired location.

77. The method of claim 76 further comprising a step of utilizing the desired location information to verify that the miller is directed to the desired location.

78. The method of claim 70 wherein the step of moving the object from the second location to the first location is responsive to the landmark information such that the first imager is initially directed to an inaccuracy area that includes the landmark.

79. The method of claim 70 wherein the step of locating the landmark comprises generating at least one image of at least one portion of the object and analyzing the at least one image in response to the landmark information.

80. The method of claim 70 wherein the step of locating the landmark comprising comparing at least one image of at least a portion of a the landmark, as generated by the first imager, with at least one image generated by a second Imager.

81. The method of claim 80 further comprising a step of angle compensation.

82. The method of claim 80 further comprising a step of imaging process variation compensation.

83. The method of claim 80 further comprising a correlation step.

* * * * *